United States Patent
Yu et al.

(10) Patent No.: US 12,418,300 B2
(45) Date of Patent: Sep. 16, 2025

(54) SIGNAL PROCESSING METHOD AND APPARATUS THEREOF

(71) Applicant: HUAWEI TECHNOLOGIES CO., LTD., Shenzhen (CN)

(72) Inventors: Tianhang Yu, Hangzhou (CN); Xiaocheng Liu, Shenzhen (CN); Gongzheng Zhang, Hangzhou (CN); Shengchen Dai, Hangzhou (CN); Rong Li, Boulogne Billancourt (FR); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 175 days.

(21) Appl. No.: 18/477,105

(22) Filed: Sep. 28, 2023

(65) Prior Publication Data
US 2024/0030931 A1    Jan. 25, 2024

Related U.S. Application Data

(63) Continuation of application No. PCT/CN2022/080460, filed on Mar. 11, 2022.

(30) Foreign Application Priority Data

Apr. 7, 2021   (CN) .......................... 202110373452.4

(51) Int. Cl.
| | |
|---|---|
| H03M 1/08 | (2006.01) |
| H03M 1/18 | (2006.01) |
| H04B 1/10 | (2006.01) |
| H04B 1/16 | (2006.01) |
| H04L 27/34 | (2006.01) |

(52) U.S. Cl.
CPC ....... *H03M 1/0854* (2013.01); *H03M 1/0836* (2013.01); *H04B 1/10* (2013.01); *H04B 1/16* (2013.01); *H04L 27/34* (2013.01); *H03M 1/183* (2013.01)

(58) Field of Classification Search
CPC .. H03M 1/0854; H03M 1/0836; H03M 1/183; H04L 27/34; H04B 1/10; H04B 1/16
USPC ................................ 341/118, 139, 143, 155
See application file for complete search history.

(56) References Cited

U.S. PATENT DOCUMENTS

| | | | |
|---|---|---|---|
| 7,508,333 B2 * | 3/2009 | Kim ..................... | H04N 19/126 341/200 |
| 9,800,264 B2 * | 10/2017 | Saito ..................... | H03M 7/55 |

\* cited by examiner

*Primary Examiner* — Khai M Nguyen
(74) *Attorney, Agent, or Firm* — HAUPTMAN HAM, LLP

(57) ABSTRACT

A signal processing method and an apparatus thereof. A first signal is received, wherein the first signal includes x symbols. N types of quantization levels are determined based on a signal distribution parameter of the first signal. A second signal is determined based on the first signal. Quantization processing is performed on the second signal to obtain x groups of first quantization results, wherein the x symbols are in one-to-one correspondence with the x groups of first quantization results. The x groups of first quantization results are mapped to a quantized first signal, wherein the quantized first signal includes x quantization levels, and each group of first quantization results is mapped to one of the N types of quantization levels. Signal processing is performed on the quantized first signal.

20 Claims, 13 Drawing Sheets

SIGNAL PROCESSING METHOD AND APPARATUS THEREOF

CROSS-REFERENCE TO RELATED APPLICATIONS

This disclosure is a continuation of International Application No. PCT/CN2022/080460, filed on Mar. 11, 2022, which claims priority to Chinese Patent Application No. 202110373452.4, filed on Apr. 7, 2021. The disclosures of the aforementioned applications are hereby incorporated by reference in their entireties.

BACKGROUND

After receiving an analog signal from a transmitting end, a receiving end samples and quantizes the analog signal to obtain quantization results, and then maps the quantization results to quantization levels. Then, a quantized signal is sent to a subsequent module for baseband signal processing, such as equalization, demodulation, and decoding. The quantization results are sequences including 0s and 1s.

An error generated by quantizing the analog signal is referred to as a quantization error, and a large quantization error reduces decoding performance Therefore, how to reduce the quantization error, especially how to reduce a quantization error of a low-precision analog-to-digital converter (analog-to-digital converter, ADC), becomes an urgent technical problem to be resolved.

SUMMARY

Embodiments described herein provide a signal processing method and an apparatus thereof. Quantization levels are determined based on a signal distribution parameter of a first signal, and this helps reduce a quantization error.

According to a first aspect, at least one embodiment provides a signal processing method. The method includes: receiving a first signal, where the first signal includes x symbols; determining N types of quantization levels based on a signal distribution parameter of the first signal; determining a second signal based on the first signal; performing quantization processing on the second signal to obtain x groups of first quantization results; mapping the x groups of first quantization results to a quantized first signal, where the quantized first signal includes x quantization levels; and performing signal processing on the quantized first signal, where the x symbols are in one-to-one correspondence with the x groups of first quantization results, and each group of first quantization results is mapped to one of the N types of quantization levels, where $N \geq 2$ and $x \geq 1$.

In this technical solution, the signal distribution parameter of the first signal represents a distribution of amplitudes of the first signal, and the N types of quantization levels are determined based on the signal distribution parameter of the first signal, so that a difference between the quantized first signal and the first signal before quantization is relatively small, that is, the quantization error is reduced.

The N types of quantization levels determined in at least one embodiment are different from quantization levels related in the foregoing conventional quantization. In the conventional quantization, intervals between adjacent quantization levels are equal. However, intervals between adjacent quantization levels in the N types of quantization levels determined in at least one embodiment are not necessarily equal. In an implementation, the quantization level in the conventional quantization is replaced with the N types of quantization levels determined in at least one embodiment; or the conventional quantization is performed on the second signal, and then each first quantization level obtained through the conventional quantization performed on the second signal is mapped, based on a correspondence between the quantization level (for example, referred to as a first quantization level, including N first quantization levels) in the conventional quantization and the N types of quantization levels determined in at least one embodiment, to one of the N types of quantization levels determined in at least one embodiment, where the N first quantization levels are in one-to-one correspondence with the N types of quantization levels determined in at least one embodiment.

In an implementation, the method further includes: determining the signal distribution parameter of the first signal by using a first scaling multiple set of a digital automatic gain control DAGC.

In an implementation, the method further includes: performing, via the DAGC, scaling processing on a reference signal of the first signal, and performing quantization processing on a reference signal obtained through the scaling processing, to obtain second quantization results, where the first scaling multiple set includes: a scaling multiple for performing scaling processing on the reference signal in response to the second quantization results meeting a first condition.

In an implementation, that the second quantization results meet a first condition includes that a value of a probability that the second quantization results include a preset bit sequence is within a preset probability value interval.

In an implementation, a specific implementation of the determining a second signal based on the first signal is: performing scaling processing on the first signal based on a second scaling multiple to obtain the second signal, where the second scaling multiple is included in the first scaling multiple set.

In an implementation, the method further includes: in response to the first signal not meeting a second condition, determining an adjustment parameter and a third scaling multiple based on the signal distribution parameter of the first signal; and a specific implementation of the determining a second signal based on the first signal includes: adjusting the first signal based on the adjustment parameter, where an adjusted first signal meets the second condition; and performing scaling processing on the adjusted first signal based on the third scaling multiple, to obtain the second signal.

In an implementation, that an adjusted first signal meets the second condition includes: a distribution of amplitudes of the adjusted first signal is represented by a weighted sum of M first distributions, and average values of the M first distributions obey a uniform distribution or absolute values of the average values of the M first distributions are equal, where $M \geq 2$.

In this technical solution, in response to the first signal not meeting the second condition, the first signal is adjusted based on the adjustment parameter, so that the adjusted first signal meets the second condition. Further, the adjusted first signal is quantized in a uniform quantization manner, and this helps reduce quantization noise.

In an implementation, the method further includes: determining, through phase estimation, a phase change value of the first signal transmitted on a channel; and a specific implementation of the determining a second signal based on the first signal is: performing phase compensation on the first signal based on the phase change value; and performing scaling processing on a first signal obtained through the phase compensation, to obtain the second signal.

In this technical solution, the phase change value of the first signal transmitted on the channel is determined through phase estimation, and phase compensation is performed on the first signal based on the phase change value. This helps offset an impact of a phase on the first signal.

In an implementation, in response to a phase change value of the first signal transmitted on a channel being non-zero, and a distribution of amplitudes of the first signal being represented by a weighted sum of N first distributions, the N types of quantization levels include an average value of each of the N first distributions.

In this technical solution, the N types of quantization levels are designed to include the average value of each of the N first distributions, so that quantization noise is relatively small.

In an implementation, the distribution of the amplitudes of the first signal is represented by a weighted sum of K first distributions, and the signal distribution parameter of the first signal includes an average value of each of the K first distributions, where K≥2.

In an implementation, the signal distribution parameter of the first signal further includes a standard deviation of each of the K first distributions.

In an implementation, the first distribution is a Gaussian distribution.

In an implementation, the first signal is a single-carrier signal.

According to a second aspect, at least one embodiment provides a communication apparatus. The communication apparatus has some or all functions in the method examples in the first aspect. For example, the functions of the communication apparatus are functions of at least one embodiment, or are a function of independently implementing at least one embodiment. The functions is implemented by hardware, or is implemented by hardware executing corresponding software. The hardware or software includes one or more units or modules corresponding to the foregoing functions.

In an implementation, a structure of the communication apparatus includes a processing unit and a communication unit. The processing unit is configured to support the communication apparatus in performing a corresponding function in the foregoing method. The communication unit is configured to support communication between the communication apparatus and another device. The communication apparatus further includes a storage unit. The storage unit is configured to be coupled to the processing unit and a sending unit, and the storage unit stores a computer program and data that are necessary for the communication apparatus.

In an implementation, the communication apparatus includes: the communication unit, configured to receive a first signal, where the first signal includes x symbols; and the processing unit, configured to: determine N types of quantization levels based on a signal distribution parameter of the first signal; determine a second signal based on the first signal; perform quantization processing on the second signal to obtain x groups of first quantization results; map the x groups of first quantization results to a quantized first signal, where the quantized first signal includes x quantization levels; and perform signal processing on the quantized first signal, where the x symbols are in one-to-one correspondence with the x groups of first quantization results, and each group of first quantization results is mapped to one of the N types of quantization levels, where N≥2 and x≥1.

In an implementation, the processing unit is further configured to: determine the signal distribution parameter of the first signal by using a first scaling multiple set of a digital automatic gain control DAGC.

In an implementation, the processing unit is further configured to: perform, via the DAGC, scaling processing on a reference signal of the first signal, and perform quantization processing on a reference signal obtained through the scaling processing, to obtain second quantization results, where the first scaling multiple set includes: a scaling multiple for performing scaling processing on the reference signal in response to the second quantization results meeting a first condition.

In an implementation, that the second quantization results meet a first condition includes that a value of a probability that the second quantization results include a preset bit sequence is within a preset probability value interval.

In an implementation, in response to the processing unit being configured to determine the second signal based on the first signal, the processing unit is specifically configured to: perform scaling processing on the first signal based on a second scaling multiple to obtain the second signal, where the second scaling multiple is included in the first scaling multiple set.

In an implementation, the processing unit is further configured to: in response to the first signal not meeting a second condition, determine an adjustment parameter and a third scaling multiple based on the signal distribution parameter of the first signal; and in response to the processing unit being configured to determine a second signal based on the first signal, the processing unit is specifically configured to: adjust the first signal based on the adjustment parameter, where an adjusted first signal meets the second condition; and perform scaling processing on the adjusted first signal based on the third scaling multiple, to obtain the second signal.

In an implementation, that an adjusted first signal meets the second condition includes: a distribution of amplitudes of the adjusted first signal is represented by a weighted sum of M first distributions, and average values of the M first distributions obey a uniform distribution or absolute values of the average values of the M first distributions are equal, where M≥2.

In an implementation, the processing unit is further configured to: determine, through phase estimation, a phase change value of the first signal transmitted on a channel; and in response to the processing unit being configured to determine the second signal based on the first signal, the processing unit is specifically configured to: perform phase compensation on the first signal based on the phase change value; and perform scaling processing on a first signal obtained through the phase compensation, to obtain the second signal.

In an implementation, in response to a phase change value of the first signal transmitted on a channel being non-zero, and a distribution of amplitudes of the first signal is represented by a weighted sum of N first distributions, the N types of quantization levels include an average value of each of the N first distributions.

In an implementation, the distribution of the amplitudes of the first signal is represented by a weighted sum of K first distributions, and the signal distribution parameter of the first signal includes an average value of each of the K first distributions, where K≥2.

In an implementation, the signal distribution parameter of the first signal further includes a standard deviation of each of the K first distributions.

In an implementation, the first distribution is a Gaussian distribution.

In an implementation, the first signal is a single-carrier signal.

For example, the processing unit is a processor, the communication unit is an input/output unit, and the storage unit is a memory.

In an implementation, the communication apparatus includes: an input/output unit, configured to receive a first signal, where the first signal includes x symbols; and a processor, configured to: determine N types of quantization levels based on a signal distribution parameter of the first signal; determine a second signal based on the first signal; perform quantization processing on the second signal to obtain x groups of first quantization results; map the x groups of first quantization results to a quantized first signal, where the quantized first signal includes x quantization levels; and perform signal processing on the quantized first signal, where the x symbols are in one-to-one correspondence with the x groups of first quantization results, and each group of first quantization results is mapped to one of the N types of quantization levels, where N≥2 and x≥1.

According to a third aspect, at least one embodiment provides a computer-readable storage medium. The computer-readable storage medium stores a computer program, and the computer program includes program instructions. In response to the program instructions being executed by a communication apparatus, the communication apparatus is enabled to perform the method according to the first aspect.

According to a fourth aspect, at least one embodiment further provides a computer program product including a computer program. In response to the computer program product running on a computer, the computer is enabled to perform the method in the first aspect.

According to a fifth aspect, at least one embodiment provides a chip system. The chip system includes at least one processor and an interface, and is configured to implement a function in the first aspect, for example, determine or process at least one of data and information in the foregoing method. In at least one embodiment, the chip system further includes a memory, and the memory is configured to store a computer program and data that are necessary for a receiving end. The chip system includes a chip, or includes a chip and another discrete device.

DESCRIPTION OF EMBODIMENTS

Figure 1A:
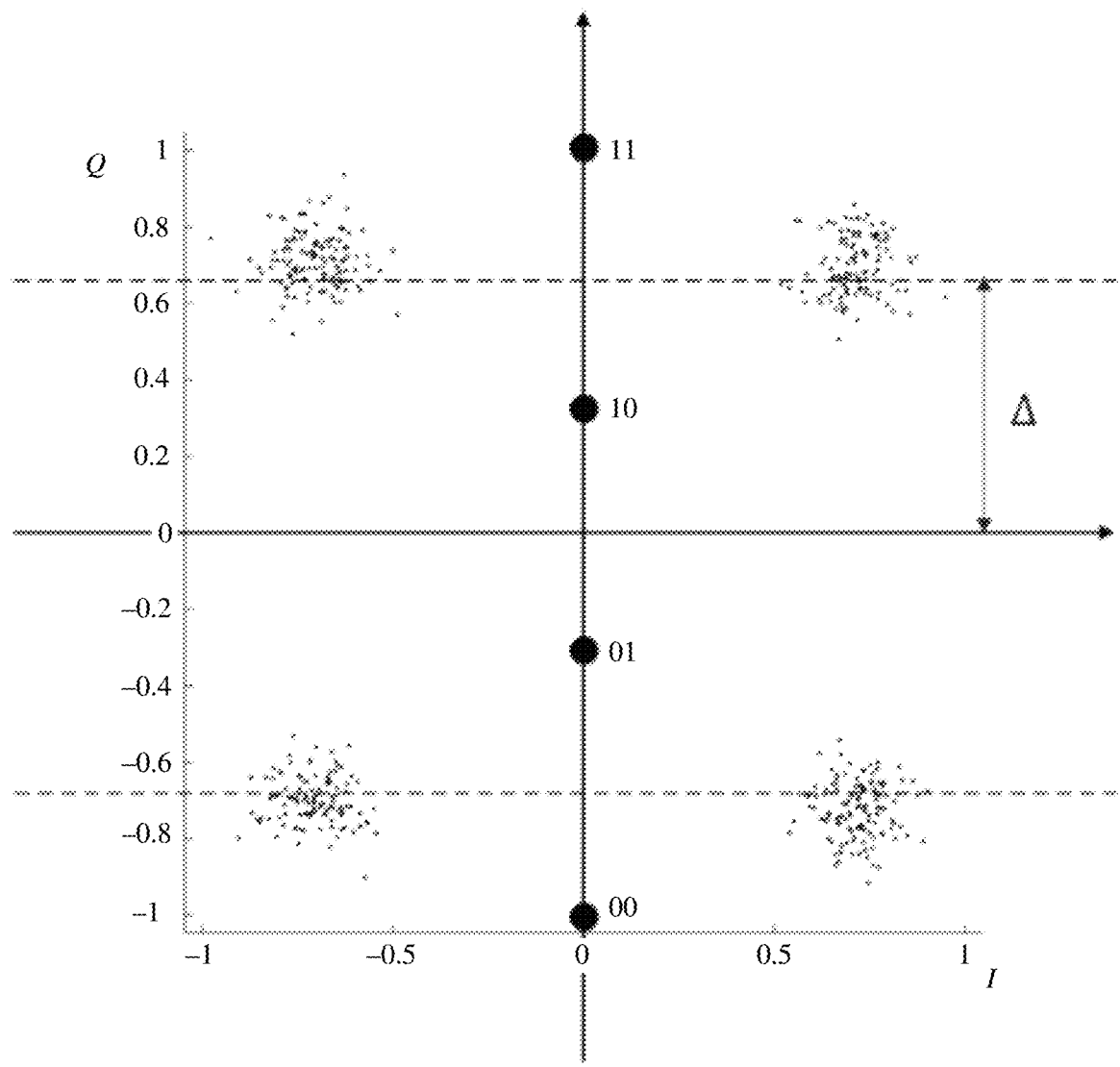
FIG. 1a is a receiving constellation diagram of a single-carrier signal whose modulation mode is 4QAM.

To better understand technical solutions provided in at least one embodiment, technical terms in at least one embodiment are first described.

1. Quantization

Quantization refers to a process of converting a received signal having consecutive values (or having a large quantity of discrete values) into a discrete digital signal. The received signal is a continuous signal or a discrete signal. For example, the received signal is the continuous signal, and a range of a continuous change of signal amplitudes is divided into limited (for example, N) non-overlapping subintervals, where each subinterval is represented by using n bits (bits). N=2n, and n is a quantity of quantization bits, or is referred to as a quantity of sampling bits. A maximum level value and a minimum level value of a subinterval are referred to as threshold levels or quantization threshold levels.

Quantization is classified into uniform quantization and non-uniform quantization. In response to intervals between adjacent threshold levels being equal, uniform quantization (or referred to as linear quantization) is performed. In response to intervals between adjacent threshold levels not being equal, non-uniform quantization is performed.

In at least one embodiment, a digital signal obtained through quantization processing is referred to as quantization results. Quantization processing is performed on each symbol that is in a received signal obtained before the quantization processing, to obtain a group of quantization results.

A range of a continuous change of signal amplitudes is divided into N non-overlapping subintervals indicates: There are N possibilities of the quantization results obtained in response to the quantization processing being performed on each symbol in the received signal. For example, in response to the received signal including only one symbol, an instantaneous level of data, of the received signal, carried on the symbol is located in any one of the N subintervals, and correspondingly obtained quantization results are different in a different subinterval. Therefore, there are N possibilities of the quantization results obtained in response to the quantization processing being performed on the symbol. Quantization results obtained in response to the quantization processing being performed on different symbols in the received signal is the same or is different.

2. Signal Reconstruction

After quantization results are obtained, further, each group of quantization results is mapped to one of a limited plurality of (for example, N) quantization levels. That is, after quantization and signal reconstruction, one symbol in a received signal is represented by one type of quantization level. The quantization level is in the N types of quantization levels, and is closest to an instantaneous level of data, of the received signal, carried on the symbol. N is a total quantity of quantization levels, or is referred to as a quantization level. The quantization level is also referred to as a reconstruction level or a quantization reconstruction level.

From the foregoing, there are the N possibilities of the quantization results obtained in response to the quantization processing being performed on each symbol of the received signal, and correspondingly, there are also N possibilities for the quantization level.

3. Quantization Error

A difference between an instantaneous level of a received signal and a quantization level obtained through quantization and signal reconstruction is referred to as a quantization error, or referred to as quantization noise.

4. Conventional Quantization

In a conventional quantization scheme, an assumption is that signals obey a uniform distribution, intervals between adjacent threshold levels are the same, and intervals between adjacent quantization levels are also the same. An example of b-bit conventional quantization is used, and an expression of a quantization level is:

$$q_r = (2r - R - 1) * \Delta/2, r = 1, 2, \ldots, R \quad (1)$$

where R represents a total quantity of quantization levels, and $R = 2^b$; and $\Delta$ is the interval between adjacent threshold levels, and is also the interval between adjacent quantization levels, that is, in this case, the interval between adjacent threshold levels is equal to the interval between adjacent quantization levels.

An assumption is that a received signal is y, and an I path (an in-phase component) and a Q path (a quadrature component) of y are quantized separately, and a quantized signal is: $r = r^I + j \cdot r^Q$. Expressions (the same for the Q path) of the I path after the b-bit conventional quantization is performed are:

$$r^I = Q(y^I) = \begin{cases} +(R-1)*\dfrac{\Delta}{2}, & y^I \geq +(R-2)*\dfrac{\Delta}{2} \\ -(R-1)*\dfrac{\Delta}{2}, & y^I < -(R-2)*\dfrac{\Delta}{2} \\ \text{round}\left(\dfrac{y^I}{\Delta} + \dfrac{1}{2}\right)*\Delta - \dfrac{\Delta}{2}, & \text{Others} \end{cases} \quad (2)$$

where $Q(y^I)$ indicates that quantization processing is performed on the I path of y, and round( ) indicates a rounding operation.

FIG. 1a is a receiving constellation diagram of a single-carrier signal y whose modulation scheme is 4-quadrature amplitude modulation (quadrature amplitude modulation, QAM). In response to 2-bit conventional quantization being performed on an I path/a Q path of the single-carrier signal y, there are four possibilities of quantization results obtained in response to the 2-bit conventional quantization being performed on each symbol of the single-carrier signal y, such as (00, 01, 10, 11) in FIG. 1a. In response to the 2-bit conventional quantization being performed on the I/Q path of the single-carrier signal y, intervals between adjacent threshold levels and intervals between adjacent quantization levels are both equal. For the 2-bit conventional quantization, expressions of quantization levels are:

$$q_r = \begin{cases} -\dfrac{3}{2}\Delta, & y < -\Delta \\ -\dfrac{1}{2}\Delta, & -\Delta \leq y < 0 \\ \dfrac{1}{2}\Delta, & 0 \leq y < \Delta \\ \dfrac{3}{2}\Delta, & y \geq \Delta \end{cases} \quad (3)$$

From the expression (3) that, for the 2-bit conventional quantization, threshold levels are $(-\Delta, 0, \Delta)$. The positive threshold level $\Delta$ and the negative threshold level $-\Delta$ have the same value but opposite signs. With reference to FIG. 1a, values of the received single-carrier signal y is distributed near four constellation points, and positive value parts and negative value parts of the four constellation points are symmetric or approximately symmetric. For example, $\Delta$ in the threshold levels $(-\Delta, 0, \Delta)$ is a value of the positive value parts of the constellation points, such as $\Delta$ marked in FIG. 1a. The four constellation points are located on dashed lines in FIG. 1a.

However, is learned from FIG. 1a, in values near each constellation point, a distance closer to the constellation point indicates more values. In response to a value of the constellation point being set to the threshold level, a difference between a value near the constellation point before quantization and a result obtained by performing quantization and signal reconstruction on the value is larger than a difference between a value away from the constellation point before quantization and a result obtained by performing the quantization and signal reconstruction on the value. In addition, because a quantity of values close to the constellation point is greater than a quantity of values away from the constellation point, an overall quantization error is relatively large. For example, results obtained by performing quantization and signal reconstruction on a value close to a constellation point in an upper right corner in FIG. 1a and a value far away from the constellation point (but near the constellation point) are both $3\Delta/2$ or $\Delta/2$. In response to a quantization error of values close to the constellation point being a1, and a quantization error of values away from the constellation point is a2, a1>a2.

From the foregoing that, in response to the conventional quantization being performed on the single-carrier signal, a relatively large quantization error is caused.

In view of this, at least one embodiment provides a signal processing method and an apparatus thereof, to help reduce a quantization error.

Figure 1B:
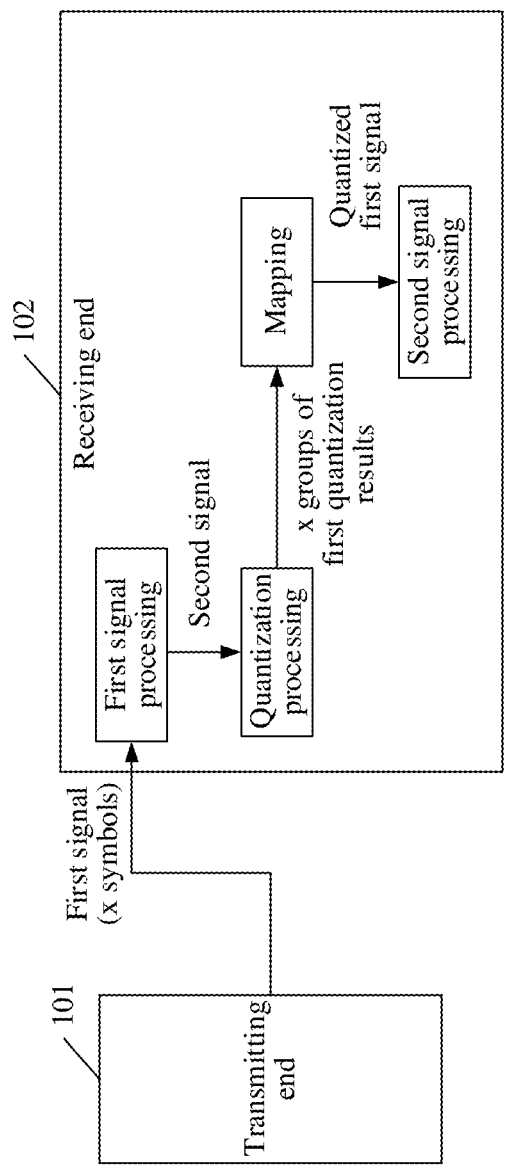
FIG. 1B is a schematic diagram of an architecture of a communication system according to at least one embodiment.

FIG. 1B is a schematic diagram of an architecture of a communication system according to at least one embodiment. The communication system includes but is not limited to one transmitting end and one receiving end. A quantity and a form of devices shown in FIG. 1B are used as an example and do not constitute a limitation on at least one embodiment. In actual application, the communication system includes two or more transmitting ends and two or more receiving ends. For example, the communication system shown in FIG. 1B includes one transmitting end 101 and one receiving end 102.

Figure 4A:
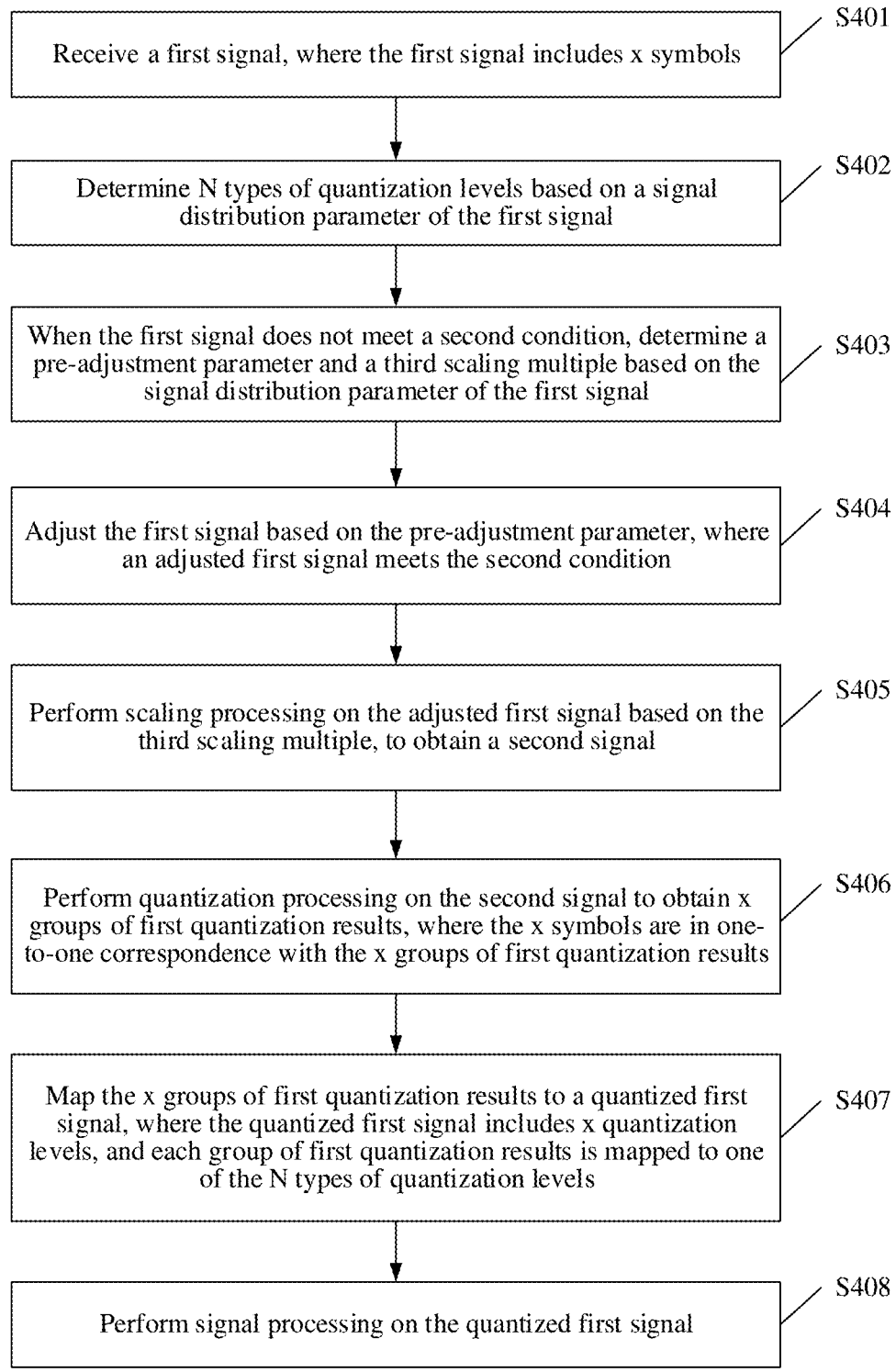
FIG. 4a is a schematic flowchart of still another signal processing method according to at least one embodiment.
Figure 5A:
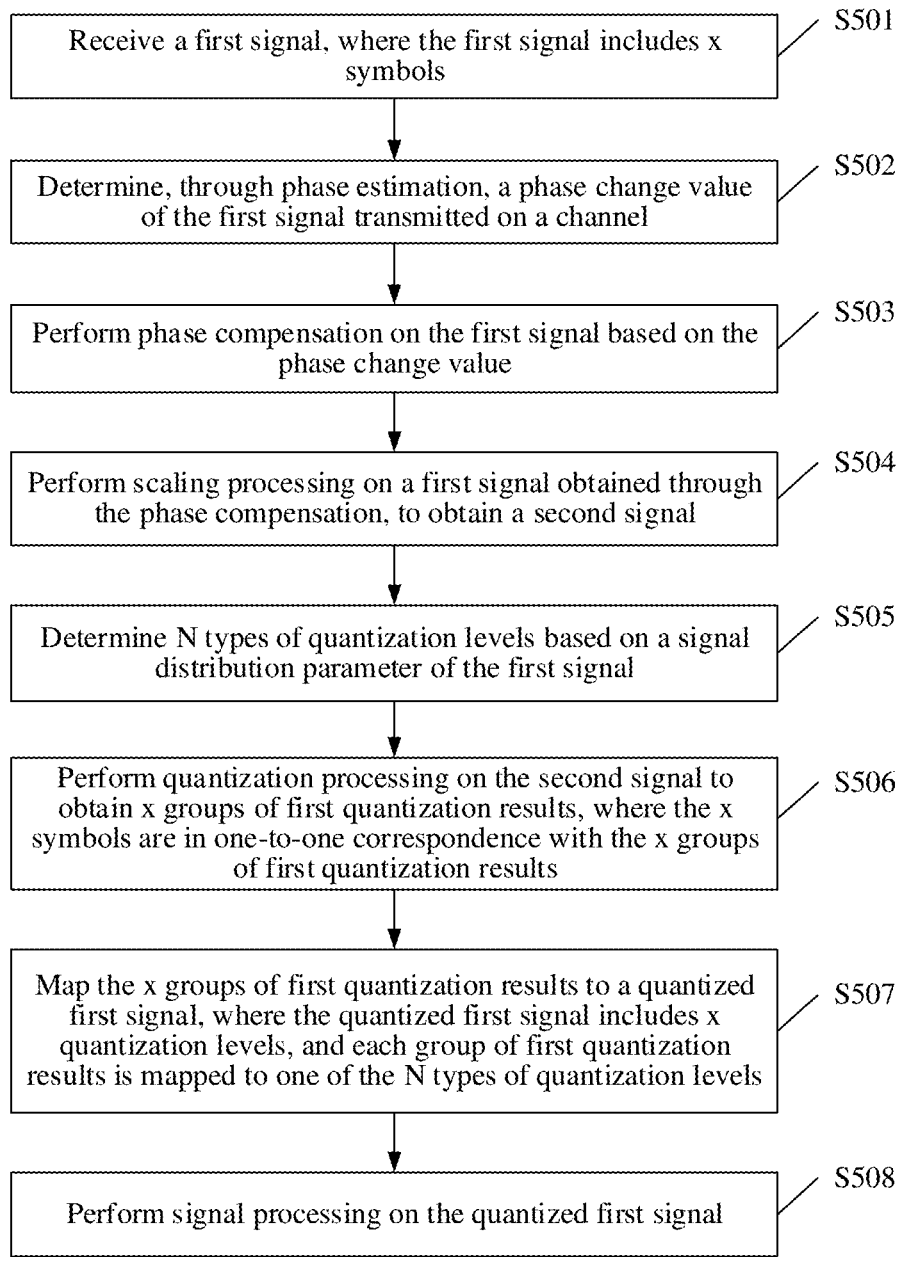
FIG. 5a is a schematic flowchart of yet another signal processing method according to at least one embodiment.

The transmitting end 101 is configured to send a first signal to the receiving end 102. Correspondingly, the receiving end 102 is configured to receive the first signal. The first signal includes x symbols, where x≥1, and x is an integer. After receiving the first signal, the receiving end 102 performs a series of processing on the first signal. For example, the series of processing performed on the first signal includes but is not limited to:

(1) determining N types of quantization levels based on a signal distribution parameter of the first signal, where quantization results corresponding to each symbol of the first signal is mapped to one of the N types of quantization levels, N≥2, and N is an integer;

(2) determining a second signal based on the first signal, where for example, as shown in FIG. 1B, first signal processing is performed on the first signal to obtain the second signal, where a quantity of symbols included in the second signal is the same as a quantity of symbols included in the first signal; and the first signal processing includes but is not limited to one or more of the following processing processes: scaling processing (for details, refer to an embodiment in FIG. 3a), preprocessing (for details, refer to an embodiment in FIG. 4a), or phase compensation (for details, refer to an embodiment in FIG. 5a);

(3) performing quantization processing on the second signal to obtain x groups of first quantization results, where the x symbols (in the second signal or the first signal) are in one-to-one correspondence with the x groups of first quantization results;

(4) mapping the x groups of first quantization results to a quantized first signal, where the quantized first signal includes x quantization levels, and each group of first quantization results is mapped to one of the N types of quantization levels; and (5) performing second signal processing on the quantized first signal. The second signal processing refers to baseband signal processing, for example, equalization, demodulation, and decoding.

The quantization levels are determined based on the signal distribution parameter of the first signal, and this helps reduce a quantization error.

The technical solutions in at least one embodiment is applied to various communication systems, for example, a long term evolution (long term evolution, LTE) system, a $5^{th}$ generation ($5^{th}$ generation, 5G) mobile communication system, or a 5G new radio (new radio, NR) system. Optionally, the method in at least one embodiment is further applicable to various future communication systems, for example, a 6G system or another communication network.

In at least one embodiment, the transmitting end 101 is an entity configured to transmit a signal, and the receiving end 102 is an entity configured to receive a signal. The transmitting end 101 is a terminal device or a network device, and the receiving end 102 is also a terminal device or a network device. The terminal device is referred to as a terminal (terminal), user equipment (user equipment, UE), a mobile station (mobile station, MS), a mobile terminal (mobile terminal, MT), or the like. The terminal device is deployed on land, including indoor, outdoor, handheld, or vehicle-mounted, or is deployed on a water surface (for example, on a ship), or is deployed in the air (for example, on an aircraft, a balloon, or an artificial satellite). The terminal device includes a handheld device, a vehicle-mounted device, a wearable device, or a computing device that has a wireless communication function. For example, the UE is a mobile phone (mobile phone), a tablet computer, or a computer with a wireless receiving and sending function. The terminal device is alternatively a virtual reality (virtual reality, VR) terminal device, an augmented reality (augmented reality, AR) terminal device, a smart vehicle (smart vehicle) terminal device, a wireless terminal in industrial control, a wireless terminal in unmanned driving, a drone, a drone controller, a wireless terminal in telemedicine, a wireless terminal in a smart grid, a wireless terminal in a smart city (smart city), a wireless terminal in a smart home (smart home), or the like. A specific technology and a specific device form that are used by the terminal device are not limited in at least one embodiment.

The network device is a radio access network (radio access network, RAN) device. The access network device includes a base station (base station, BS), and is a device that is deployed in a radio access network and that performs wireless communication with a terminal device. The base station has a plurality of forms, such as a macro base station, a micro base station, a relay station, an access point, a satellite, and a drone. For example, the access network device is a base station in 5G or a base station in an LTE system. The base station in 5G is also referred to as a transmission/reception point (transmission/reception point, TRP) or a next generation NodeB (next generation NodeB, gNB). A specific technology and a specific device form that are used by the network device are not limited in at least one embodiment.

The communication system described in at least one embodiment is used to describe the technical solution in at least one embodiment more clearly, but does not limit the technical solution provided in at least one embodiment. A person skilled in the art is able to learn that with evolution of a system architecture and emergence of a new service scenario, the technical solutions provided in at least one embodiment is also applicable to a similar technical problem.

The following describes in detail a signal processing method and an apparatus thereof provided in at least one embodiment with reference to the accompanying drawings.

Figure 2A:
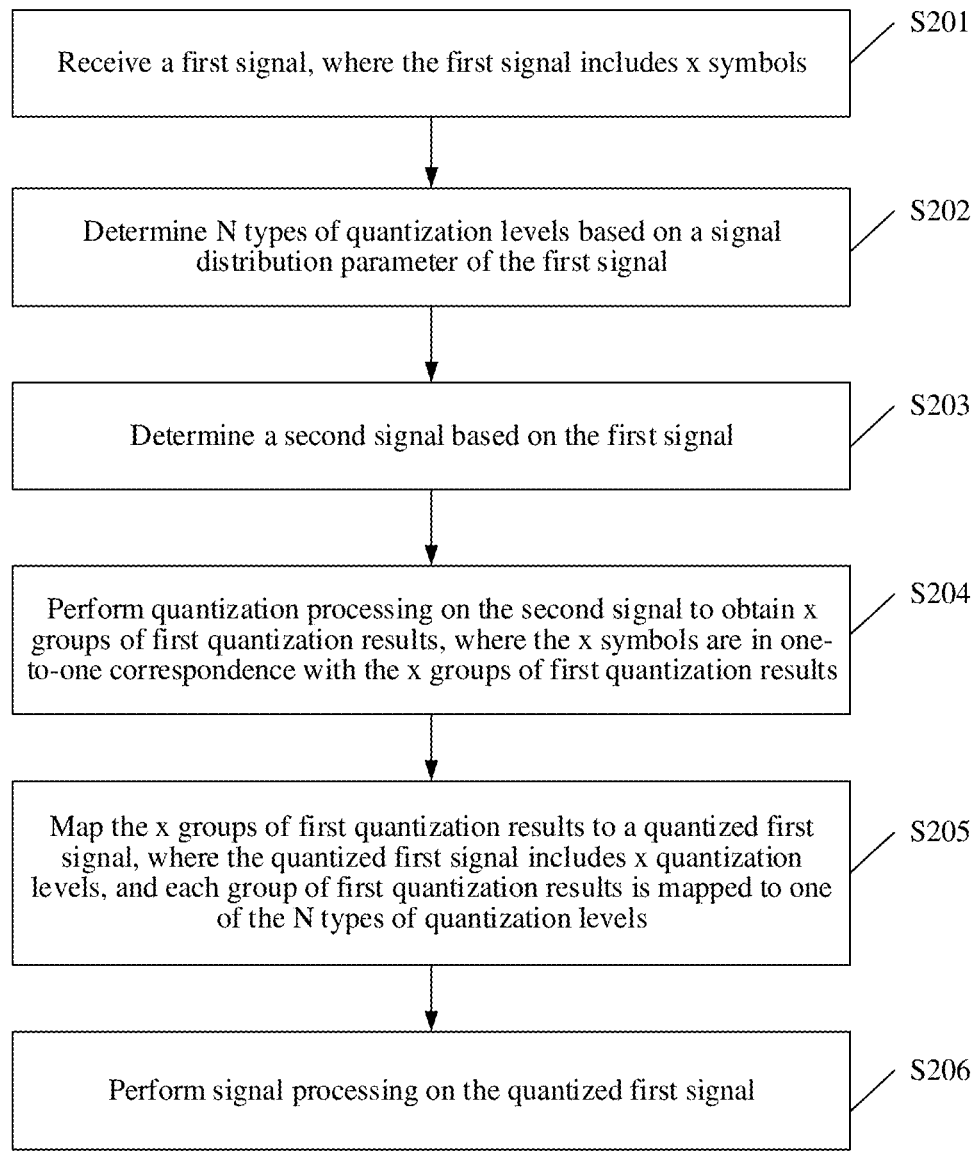
FIG. 2a is a schematic flowchart of a signal processing method according to at least one embodiment.

FIG. 2a is a schematic flowchart of a signal processing method according to at least one embodiment. In the method, expressions of N types of quantization levels determined based on a signal distribution parameter of a first signal are described in detail. Step S201 to step S206 are performed by a receiving end, or a chip in the receiving end. The following uses an example in which the receiving end performs the signal processing method for description. As shown in FIG. 2a, the method includes but is not limited to the following steps.

Step S201: Receive a first signal, where the first signal includes x symbols, and x≥1.

The first signal is a control signal or a data signal. This is not limited in at least one embodiment.

Step S202: Determine the N types of quantization levels based on the signal distribution parameter of the first signal, where N≥2.

The signal distribution parameter of the first signal represents a distribution of amplitudes of the first signal. The N types of quantization levels related in signal reconstruction are determined based on the signal distribution parameter of the first signal, so that a difference between a quantized first signal obtained through signal reconstruction and the first signal before quantization is relatively small, that is, a quantization error is reduced.

In an implementation, the amplitudes of the first signal is represented by a first distribution. In this case, the signal distribution parameter of the first signal includes an average value of the first distribution. Optionally, the signal distribution parameter of the first signal further includes a standard deviation or a variance of the first distribution. The meaning of that "the amplitudes of the first signal are represented by a first distribution" mentioned in at least one embodiment is as follows: The amplitudes of the first signal obey or approximately obey the first distribution, or a probability density function of the amplitudes of the first signal is represented by a probability density function of the first distribution.

In another implementation, the amplitudes of the first signal is represented by a weighted sum of K first distributions. In this case, the signal distribution parameter of the first signal includes an average value of each of the K first distributions, where K≥2 and K is an integer. The weighted sum of the K first distributions is a mixed distribution including the K first distributions. For example, in response to K=2, and the first distribution being a Gaussian distribution, the weighted sum is a mixed Gaussian distribution including two Gaussian distributions. The meaning of "the amplitudes of the first signal are represented by a weighted sum of K first distributions" mentioned in at least one embodiment is as follows: The amplitudes of the first signal obey or approximately obey the mixed distribution including the K first distributions, or a probability density function of the amplitudes of the first signal is represented by a probability density function of the mixed distribution including the K first distributions.

For example, in response to K=N=4, and the amplitudes of the first signal being represented by a weighted sum of K (K=4) Gaussian distributions, the signal distribution parameter of the first signal includes an average value of each of the four Gaussian distributions. In response to average values of the four Gaussian distributions being respectively $\mu_1$, $\mu_2$, $\mu_3$, and $\mu_4$, where $\mu_1 \leq \mu_2 \leq \mu_3 \leq \mu_4$, $\mu_1 = -\mu_4$, and $\mu_2 = -\mu_3$, four types of quantization levels is ($\mu_1$, $\mu_2$, $\mu_3$, $\mu_4$). In response to 2-bit uniform quantization being performed on the first signal, intervals between adjacent threshold levels are equal, and threshold levels is $$\left(-\frac{\mu_3 + \mu_4}{2}, 0, \frac{\mu_3 + \mu_4}{2}\right).$$

That is, expressions of the four types of quantization levels is as follows:

$$q_r = \begin{cases} \mu_1, & y < -\frac{\mu_3 + \mu_4}{2} \\ \mu_2, & -\frac{\mu_3 + \mu_4}{2} \leq y < 0 \\ \mu_3, & 0 \leq y < \frac{\mu_3 + \mu_4}{2} \\ \mu_4, & y \geq \frac{\mu_3 + \mu_4}{2} \end{cases} \quad (4)$$

Optionally, the signal distribution parameter of the first signal further includes a standard deviation or a variance of each of the K first distributions. The first distribution is a Gaussian distribution, a uniform distribution, or another mathematical distribution. This is not limited in at least one embodiment.

For example, in response to K=2, N=4, and the amplitudes of the first signal being represented by a weighted sum of K (K=2) Gaussian distributions, the signal distribution parameter of the first signal includes an average value and a standard deviation of each of the two Gaussian distributions. In response to the average values of the two Gaussian distributions being respectively $\mu_1$, and $\mu_2$, where $\mu_1 \leq \mu_2$, and the standard deviations of the two Gaussian distributions are respectively $\sigma_1$ and $\sigma_2$, where $\mu_1 = -\mu_2$, and $\sigma_1 = \sigma_2$, expressions of four types of quantization levels is as follows:

$$q_r = \begin{cases} \mu_1 - a * \sigma_1 \\ \mu_1 + a * \sigma_1 \\ \mu_2 - a * \sigma_2 \\ \mu_2 + a * \sigma_2 \end{cases} \quad (5)$$

In the expression (5), a is a coefficient, and the coefficient is a real number, for example, a=1 or $$\sqrt{\frac{2}{\pi}}.$$

in at least one embodiment, a is preset by the receiving end, for example, set by experience, or a is agreed on in a protocol. Optionally, the receiving end modifies a value of a. Preferably, $$a = \sqrt{\frac{2}{\pi}}.$$

In this case, optimal quantization is implemented.

In response to the 2-bit uniform quantization being performed on a second signal determined based on the first signal, intervals between adjacent threshold levels are equal, and threshold levels is ($\mu_1$, 0, $\mu_2$). That is, the expressions of the four types of quantization levels in the foregoing expression (5) are changed to:

$$q_r = \begin{cases} \mu_1 - a * \sigma_1, & y < \mu_1 \\ \mu_1 + a * \sigma_1, & \mu_1 \leq y < 0 \\ \mu_2 - a * \sigma_2, & 0 \leq y < \mu_2 \\ \mu_2 + a * \sigma_2, & y \geq \mu_2 \end{cases},$$

in other words, $$q_r = \begin{cases} -\mu_2 - a * \sigma_2, & y < -\mu_2 \\ -\mu_2 + a * \sigma_2, & -\mu_2 \leq y < 0 \\ \mu_2 - a * \sigma_2, & 0 \leq y < \mu_2 \\ \mu_2 + a * \sigma_2, & y \geq \mu_2 \end{cases} \quad (6)$$

Optionally, the first signal is a single-carrier signal. In response to the first signal being a single-carrier signal, the amplitudes of the first signal is represented by a Gaussian distribution or a weighted sum of the Gaussian distribution. Optionally, the first signal is a signal presenting a single-carrier characteristic. In response to amplitudes of a signal being represented by a Gaussian distribution or a weighted sum of the Gaussian distribution, the signal is considered as a signal presenting a single-carrier characteristic.

Optionally, intervals between adjacent quantization levels in the foregoing N types of quantization levels is equal or is unequal. The N types of quantization levels determined in at least one embodiment are different from quantization levels related in the foregoing conventional quantization. In the conventional quantization, intervals between adjacent quantization levels are equal. However, intervals between adjacent quantization levels in the N types of quantization levels determined in at least one embodiment are not necessarily equal. In an implementation, the receiving end replaces the quantization level in the conventional quantization with the N types of quantization levels determined in at least one embodiment; or the receiving end performs the conventional quantization on the second signal, and then each first quantization level obtained through the conventional quantization performed on the second signal is mapped, based on a correspondence between the quantization level (for example, referred to as a first quantization level, including N first quantization levels) in the conventional quantization and the N types of quantization levels determined in at least one embodiment, to one of the N types of quantization levels determined in at least one embodiment, where the N first quantization levels are in one-to-one correspondence with the N types of quantization levels determined in at least one embodiment.

Step S203: Determine the second signal based on the first signal.

In at least one embodiment, after receiving the first signal, the receiving end performs first signal processing on the first signal, to obtain the second signal. The first signal processing includes but is not limited to one or more of the following processing processes: scaling processing, preprocessing, or phase compensation. For example, the first signal processing includes scaling processing, and the second signal is obtained by performing scaling processing on the first signal. Specifically, the receiving end performs scaling processing on the first signal via a digital automatic gain control (digital automatic gain control, DAGC), to obtain the second signal.

After determining the second signal, the receiving end performs quantization processing on the second signal. For example, quantization processing is performed on the second signal via an analog-to-digital converter (analog-to-digital converter, ADC). In this case, amplitudes of the second signal is to fall within a dynamic range of the ADC. In other words, the receiving end is to adjust a scaling multiple of the DAGC, so that after the scaling processing is performed on the first signal based on the scaling multiple, the amplitudes of the obtained second signal fall within the dynamic range of the ADC. Specifically, the receiving end controls the scaling multiple of the DAGC via a DAGC control module.

The dynamic range of the ADC indicates a maximum value and a minimum value of an amplitude that is reliably measured by the ADC. For example, the dynamic range of the ADC is [−100, 100], to be specific, the maximum value of the amplitude that is reliably measured by the ADC is 100, and the minimum value is −100. In response to a range of the amplitudes of the first signal being [−1, 1], the receiving end amplifies the first signal, so that the amplitudes of the second signal obtained through the amplification fall within the range of [−100, 100].

The foregoing uses an example in which the first signal processing includes only scaling processing. This does not constitute a limitation. The first signal processing further includes another processing process.

Step S204: Perform quantization processing on the second signal to obtain x groups of first quantization results, where the x symbols are in one-to-one correspondence with the x groups of first quantization results.

After determining the second signal, the receiving end performs quantization processing on each symbol that is in the second signal, and obtain a group of first quantization results for each symbol. The second signal and the first signal include a same quantity of symbols. Therefore, the x groups of first quantization results are obtained in step S204. In at least one embodiment, the quantization results (for example, the first quantization results or a second quantization results below) are a sequence including 0s and 1s. In response to b-bit uniform quantization being performed on the second signal, the obtained first quantization results are a sequence including b 0s and 1s.

In response to the b-bit uniform quantization being performed on the second signal, first quantization results obtained by performing quantization processing on each symbol is one of $2^b$ types of first quantization results. For example, b=2, and the $2^b$ types of first quantization results are (00, 01, 10, 11). First quantization results obtained in response to the quantization processing being performed on different symbols is the same or is different. For example, in response to the second signal including three symbols, and data carried in the three symbols all falling near a constellation point shown in an upper right corner in FIG. 1a, and is all above a dashed line, first quantization results obtained by performing quantization processing on the three symbols are all 11. For another example, in response to the second signal including three symbols, and data carried in two of the symbols both falling near a constellation point shown in an upper right corner in FIG. 1a, and is both above a dashed line, first quantization results obtained by performing quantization processing on the two symbols are both 11. In response to data carried in the remaining symbol falling near the constellation point shown in the upper right corner in FIG. 1a, and being below the dashed line, first quantization results obtained by performing quantization processing on the symbol are 10.

In at least one embodiment, a quantization bit quantity for quantization processing is not limited. For example, the quantization bit quantity is 1, 2, 3, 4, 5, or another quantity. In other words, in at least one embodiment, high-precision quantization such as 4-bit or 5-bit quantization is performed, or low-precision quantization such as 1-bit to 3-bit quantization is performed. Before quantization processing, scaling processing is performed via the DAGC, and this reduces quantization noise of a low-precision ADC in a larger amplitude compared with that of a high-precision ADC.

In an implementation, in response to the distribution of the amplitudes of the first signal being represented by the weighted sum of K (K≥2) first distributions, and a relationship between a quantity N of types of quantization levels and K being $N \leq 2^{\lfloor (\log_2 K) + 1 \rfloor}$, the received first signal is processed by using the signal processing method provided in at least one embodiment. In response to the distribution of the amplitudes of the first signal being represented by the weighted sum of K (K=1) first distributions, and a relationship between a quantity N of types of quantization levels and K being $N \leq 2^{\lfloor (\log_2 K) + 1 \rfloor}$, the received first signal is processed by using the signal processing method provided in at least one embodiment. For example, in response to K=2, and N=2 or 4; or in response to K=4, and N=2, 4, or 8; or in response to K=1, and N=2 or 4, the received first signal is processed by using the signal processing method provided in at least one embodiment.

In an implementation, in response to the distribution of the amplitudes of the first signal being represented by the weighted sum of K (K≥4) first distributions, a relationship between a quantity N of types of quantization levels and K is $N \leq 2^{\lfloor (\log_2 K) + 1 \rfloor}$ and average values of the K first distributions obey a uniform distribution, the received first signal is processed by using the signal processing method provided in at least one embodiment. That average values of the K first distributions obey a uniform distribution means: Intervals between adjacent average values of the K first distributions are the same. Alternatively, in response to the distribution of the amplitudes of the first signal being represented by the weighted sum of K (K=2) first distributions, a relationship between a quantity N of types of quantization levels and K is $N \leq 2^{[(log_2 K)+1]}$, where for example, N=2 or 4, and absolute values of average values of the K first distributions are equal, the received first signal is processed by using the signal processing method provided in at least one embodiment. That absolute values of average values of the K (K=2) first distributions are equal means: The average values of the two first distributions are symmetric, to be specific, one average value is a positive number, the other average value is a negative number, and the absolute values of the two average values are equal. Alternatively, in response to the distribution of the amplitudes of the first signal being represented by the K (K=1) first distributions, and a relationship between a quantity N of types of quantization levels and K being $N \leq 2^{[(log_2 K)+1]}$, that is, N=2 or 4, the received first signal is processed by using the signal processing method provided in at least one embodiment. In at least one embodiment, the quantization processing performed on the second signal is uniform quantization processing or non-uniform quantization processing.

An execution sequence of step S202 and step S203 and step S204 is not limited in at least one embodiment. For example, the receiving end performs step S202, step S203, and step S204 in sequence, or performs step S203, step S204, and step S202 in sequence, or performs step S203, step S202, and step S204 in sequence.

Step S205: Map the x groups of first quantization results to the quantized first signal, where the quantized first signal includes x quantization levels, and each group of first quantization results is mapped to one of the N types of quantization levels.

After obtaining the x groups of first quantization results, the receiving end maps each of the x groups of first quantization results to one of the N types of quantization levels in step S202, to obtain the x quantization levels. The quantization level to which each group of first quantization results is mapped is one of the N types of quantization levels. Same first quantization results are mapped to a same quantization level, and different first quantization results are mapped to different quantization levels.

For example, in response to N=4, the 2-bit uniform quantization being performed on the second signal (that is, there are four possibilities of the first quantization results), the four types of first quantization results are (00, 01, 10, 11), and the N types of quantization levels are (quantization level 1, quantization level 2, quantization level 3, quantization level 4), the receiving end maps the x groups of first quantization results to the quantized first signal based on a mapping relationship shown in Table 1. Quantization level 1<quantization level 2<quantization level 3<quantization level 4.

TABLE 1

Mapping relationship between the first quantization results and the quantization level

| First quantization results | Quantization level |
| --- | --- |
| 00 | Quantization level 1 |
| 01 | Quantization level 2 |
| 10 | Quantization level 3 |
| 11 | Quantization level 4 |

In at least one embodiment, each group of first quantization results is mapped to one of the N types of quantization levels, and the N types of quantization levels are determined based on the signal distribution parameter of the first signal, so that quantization noise generated in a quantization process and the first signal obey or approximately obey a same distribution. For example, in response to the first signal being represented by a Gaussian distribution or represented by a weighted sum of K Gaussian distributions, in other words, in response to the first signal obeying (or approximately obeying) a Gaussian distribution or a mixed Gaussian distribution, there is a high probability that quantization noise generated by performing quantization processing on the second signal obtained based on the first signal obeys (or approximately obeys) the Gaussian distribution or the mixed Gaussian distribution. A Gaussian noise model is a basis for subsequent signal processing (for example, equalization and demodulation). In response to the quantization noise obeying (or approximately obeying) the Gaussian distribution or the mixed Gaussian distribution, subsequent signal processing performance is improved. For example, decoding performance is improved.

Figure 2B:
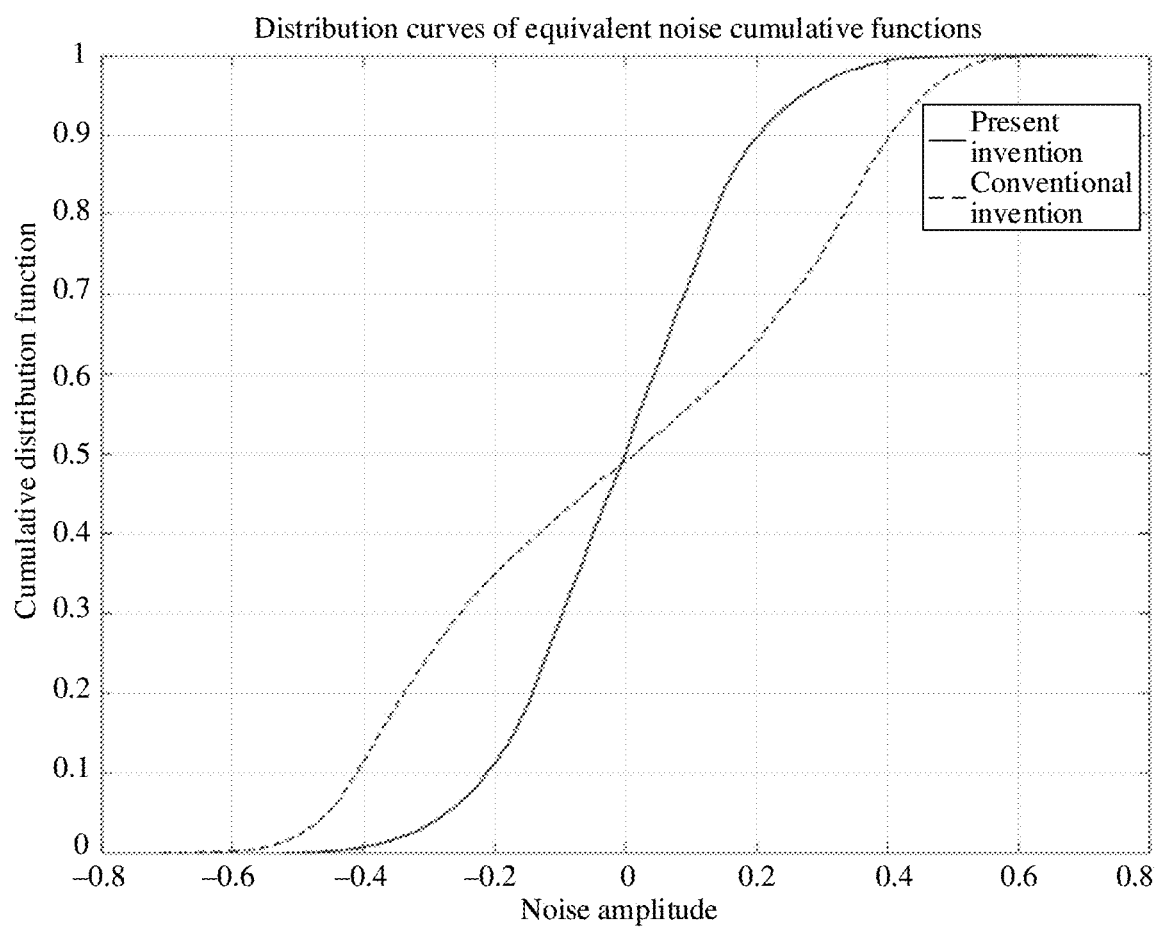
FIG. 2b is a line graph of a cumulative distribution function of quantization noise.

Refer to FIG. 2b. A dashed line is a line graph of a cumulative distribution function of quantization noise generated by performing conventional quantization on a single-carrier signal, and a solid line is a line graph of a cumulative distribution function of quantization noise generated by performing quantization processing on the second signal obtained based on the first signal (which is a single-carrier signal in this case). In response to a slope of a curve of a cumulative distribution function of quantization noise presenting a rule of increasing to a maximum value and then decreasing with time, the quantization noise corresponding to the curve obeys or approximately obeys the Gaussian distribution; and in response to the slope not presenting the rule, the quantization noise corresponding to the curve deviates from the Gaussian distribution. From FIG. 2b that a slope of the line graph shown by the dashed line does not present the foregoing rule, in other words, in response to the conventional quantization being performed on the single-carrier signal, the generated quantization noise deviates from the Gaussian distribution; and a slope of the line graph shown by the solid line presents the foregoing rule, in other words, by implementing at least one embodiment, the generated quantization noise obeys or approximately obeys the Gaussian distribution.

Step S206: Perform signal processing on the quantized first signal.

After obtaining the quantized first signal, the receiving end performs signal processing (for example, perform second signal processing) on the quantized first signal. The second signal processing includes but is not limited to one or more of the following: scaling processing, baseband signal processing, or application layer processing.

In at least one embodiment, the signal distribution parameter of the first signal represents the distribution of the amplitudes of the first signal, and the N types of quantization levels are determined based on the signal distribution parameter of the first signal, so that the difference between the quantized first signal and the first signal before quantization is relatively small, that is, the quantization error is reduced.

The following embodiments are described by using an example in which K and N are determined values, and this does not constitute a limitation. In addition, content mentioned in an embodiment in which N is a value is combined with another embodiment in which N is a different value.

Figure 3A:
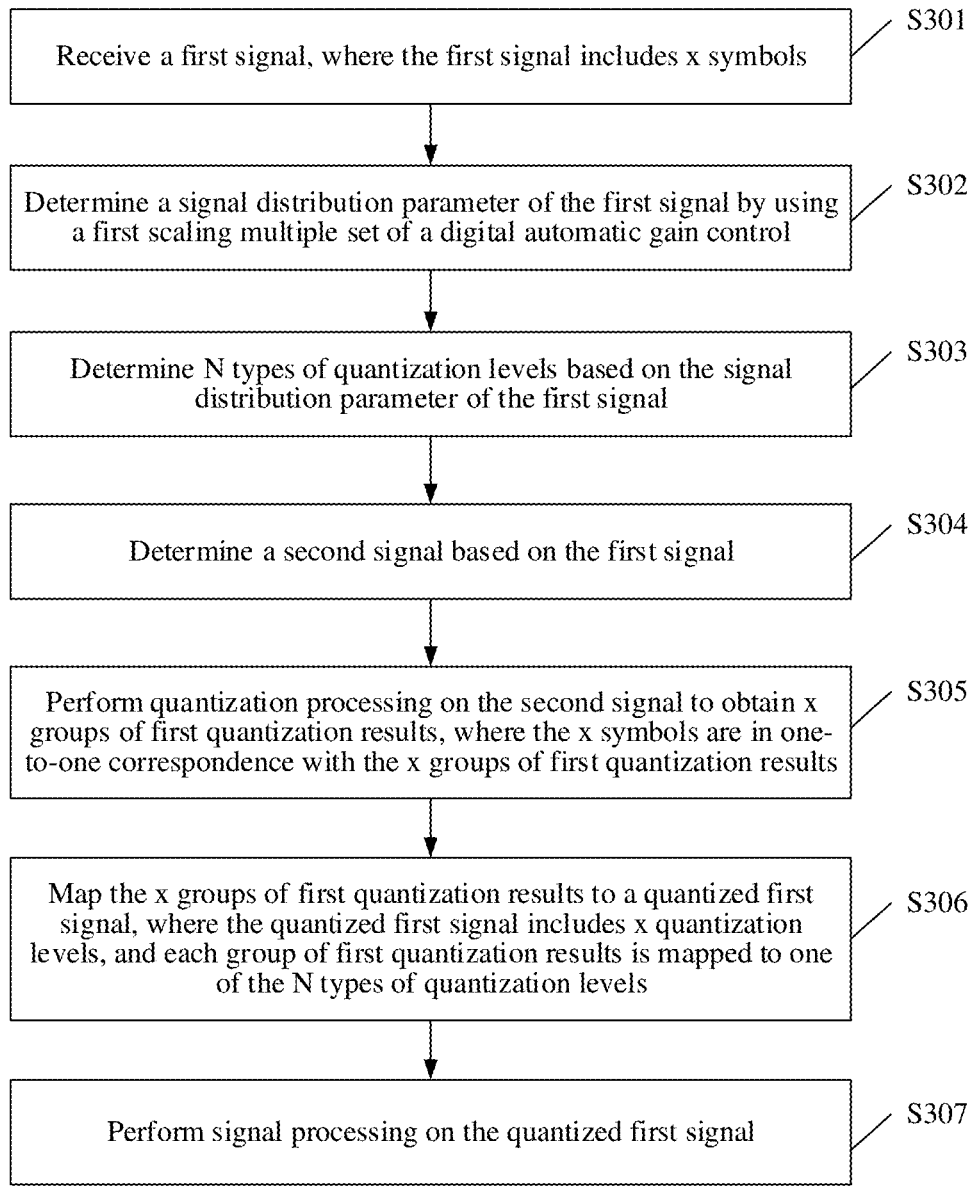
FIG. 3a is a schematic flowchart of another signal processing method according to at least one embodiment.

FIG. 3a is a schematic flowchart of another signal processing method according to at least one embodiment. The method describes in detail how to determine a first scaling multiple set and how to determine a signal distribution parameter of a first signal by using the first scaling multiple set. Step S301 to step S307 are performed by a receiving end, or a chip in the receiving end. The following uses an example in which the receiving end performs the signal processing method for description. As shown in FIG. 3a, the method includes but is not limited to the following steps.

Step S301: Receive the first signal, where the first signal includes x symbols, and x≥1.

For an execution process of step S301, refer to the specific descriptions of step S201 in FIG. 2a. Details are not described herein again.

Step S302: Determine the signal distribution parameter of the first signal by using the first scaling multiple set of a digital automatic gain control DAGC.

The signal distribution parameter of the first signal is the same as a signal distribution parameter of a reference signal of the first signal. The signal distribution parameter of the reference signal of the first signal is determined by using the first scaling multiple set of the DAGC. The receiving end also determines the signal distribution parameter of the first signal by using the first scaling multiple set of the DAGC.

In an implementation, after receiving the reference signal of the first signal, the receiving end trains a scaling multiple of the DAGC based on the reference signal of the first signal, to determine the first scaling multiple set. A specific process is as follows: The receiving end performs, via the DAGC, scaling processing on the reference signal of the first signal, and perform quantization processing on a reference signal obtained through the scaling processing, to obtain second quantization results, where the first scaling multiple set includes: a scaling multiple for performing scaling processing on the reference signal in response to the second quantization results meeting a first condition. In other words, the receiving end adjusts the scaling multiple of the DAGC, so that after scaling processing is performed on the reference signal of the first signal based on an adjusted scaling multiple, the second quantization results obtained by performing quantization processing on a reference signal obtained through the scaling processing meet the first condition. In this case, the adjusted scaling multiple is included in the first scaling multiple set.

A quantity of symbols included in the reference signal of the first signal is the same as or different from a quantity of symbols included in the first signal, and quantization processing is performed on one symbol that is in the reference signal to obtain a group of second quantization results. The second quantization results are a sequence including 0s and 1s. In an implementation, that the second quantization results meet a first condition includes: A value of a probability that the second quantization results include a preset bit sequence is within a preset probability value interval, or a value of a probability that the second quantization results include a preset bit sequence set (or referred to as a preset bit sequence pair) is within a preset probability value interval. The preset bit sequence set includes two sequences, and threshold levels corresponding to each sequence in the preset bit sequence set are opposite numbers to each other. For example, the preset bit sequence set includes two sequences: 00 and 11. 00 corresponds to quantization level 1, 11 corresponds to quantization level 2, and quantization level 1 and quantization level 2 are opposite numbers to each other. The preset probability value interval includes a preset probability value, and that a value of a probability that the second quantization results include a preset bit sequence is within a preset probability value interval indicates: The value of the probability that the obtained second quantization results include the preset bit sequence is the preset probability value or is close to the preset probability value.

For example, in response to the preset probability value is 0.1587, the preset probability value interval is [0.158741, 0.1587+i2], where both i1 and i2 are positive numbers, and i1 and i2 is equal or not equal.

The first scaling multiple set includes one or more first scaling multiples. In response to the first scaling multiple set including a plurality of first scaling multiples, there is a plurality of preset bit sequences (or a plurality of preset bit sequence sets or indexes determined in a preset mapping manner). One first scaling multiple is correspondingly determined for one preset bit sequence (or preset bit sequence set). One preset bit sequence (or preset bit sequence set) corresponds to one preset probability value, in other words, one preset bit sequence (or preset bit sequence set) corresponds to one preset probability value interval. For example, in response to preset bit sequence 1 (for example, 000 or 111) corresponding to preset probability value interval 1, preset bit sequence 2 (for example, 011 or 100) corresponding to preset probability value interval 2, and a value of a probability that the second quantization results include preset bit sequence 1 (for example, 000 or 111) being within preset probability value interval 1, the receiving end determines a scaling multiple of the DAGC in this case as first scaling multiple_1; and in response to a value of a probability that the second quantization results include preset bit sequence 2 (for example, 011 or 100) being within preset probability value interval 2, the receiving end determines a scaling multiple of the DAGC in this case as first scaling multiple_2.

Alternatively, in response to preset bit sequence set 1 (for example, {000, 111}) corresponding to preset probability value interval 3, preset bit sequence set 2 (for example, {011, 100}) corresponding to preset probability value interval 4, and a value of a probability that the second quantization results include preset bit sequence set 1 (for example, {000, 1111}) being within preset probability value interval 3, the receiving end determines a scaling multiple of the DAGC in this case as first scaling multiple_1. Similarly, in response to a value of a probability that the second quantization results include preset bit sequence set 2 (for example, {011, 100}) being within preset probability value interval 4, the receiving end determines a scaling multiple of the DAGC in this case as first scaling multiple_2. Preset probability value 3 corresponding to preset probability value interval 3 is twice as many as preset probability value 1 corresponding to preset probability value interval 1. Similarly, preset probability value 4 corresponding to preset probability value interval 4 is twice as many as preset probability value 2 corresponding to preset probability value interval 2. Optionally, first scaling multiple_1 and first scaling multiple_2 is equal or unequal.

Figure 3B:
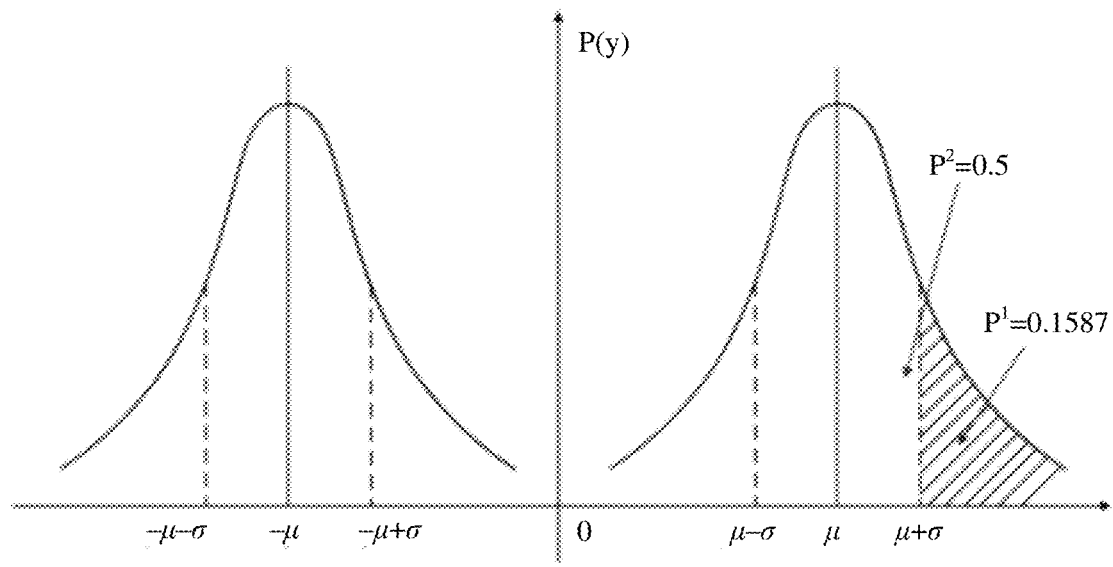
FIG. 3b is a schematic diagram of probability density curves of a mixed Gaussian distribution including two Gaussian distributions.

For example, the reference signal of the first signal obeys a mixed Gaussian distribution, and a schematic diagram of probability density curves of the mixed Gaussian distribution is shown in FIG. 3b. In FIG. 3b, positive and negative parts are two (namely, K=2) symmetric Gaussian distributions. Because the two Gaussian distributions are symmetric, absolute values of average values of the two Gaussian distributions are equal and are both u, and standard deviations of the two Gaussian distributions are equal and are both σ. 2-bit (that is, N=4) uniform quantization processing is performed on a third signal determined based on the reference signal of the first signal, threshold levels are $\{-2z/3, 0, 2z/3\}$, and a mapping relationship between quantization results obtained through the quantization processing and a quantization level is shown in Table 2. In Table 2, z is a constant. A process of determining the third signal based on the reference signal of the first signal is similar to a process of determining the second signal based on the first signal. For details, refer to the descriptions in step S203. Optionally, z is set by the receiving end or agreed on in a protocol, for example, set by experience.

TABLE 2

Mapping relationship between first quantization results and the quantization level

| First quantization results | Quantization level |
|---|---|
| 00 | $-z$ |
| 01 | $-z/3$ |
| 10 | $z/3$ |
| 11 | $z$ |

From a Gaussian distribution theorem: $P(|y|\geq\mu)=0.5$, and $P(|y|\geq\mu+a)=0.1587$.

A process of determining the first scaling multiple by the receiving end is as follows: The receiving end adjusts the scaling multiple of the DAGC, where for example, the adjusted scaling multiple is $C_1$. The receiving end performs scaling processing on a reference signal y of the first signal based on $C_1$ to obtain a reference signal $y'=C_1 y$ obtained through the scaling processing. In response to a probability that the second quantization results obtained by performing uniform quantization processing on y' include [00,11] being approximately 0.5, $C_1$ is the first scaling multiple. In response to $P(|y|\geq\mu)=0.5$ and the second quantization results being 11, the corresponding threshold level is $2z/3$, so that the following relational expression is obtained: $C_1\cdot\mu=2z/3$. Alternatively, in response to $P(|y|\mu)=0.5$ and the second quantization results being 00, the corresponding threshold level is $-2z/3$, so that the following relational expression is obtained: $C_1$ $(-\mu)=-2z/3$. Therefore, in response to the signal distribution parameter includes the average value μ, $\mu=2z/(3\cdot C_1)$. A probability that the obtained second quantization results include [00,11] is approximately 0.5 is learned through statistics collection. For example, in response to y' including 100 symbols, 100 groups of second quantization results are obtained by performing uniform quantization processing on y'. In response to the 100 groups of second quantization results including 50 groups of second quantization results [00,11], the probability that the second quantization results is determined that includes [00,11] is approximately 0.5.

A process of determining the first scaling multiple by the receiving end further includes: The receiving end adjusts the scaling multiple of the DAGC, for example, the adjusted scaling multiple is $C_2$. The receiving end performs scaling processing on the reference signal y of the first signal based on $C_2$ to obtain a reference signal $y''=C_2\cdot y$ obtained through the scaling processing. In response to a probability that the second quantization results obtained by performing uniform quantization processing on y'' include [00,11] being approximately 0.1587, $C_2$ is the first scaling multiple. In this case, the first scaling multiple level set includes $C_1$ and $C_2$. In response to $P(|y|\geq\mu+\sigma)=0.1587$ and the second quantization results being 11, the corresponding threshold level is $2z/3$, so that the following relational expression is obtained: $C_2\cdot(\mu+\sigma)=2z/3$. Alternatively, in response to $P(|y|\geq\mu+\sigma)=0.1587$ and the second quantization results being 00, the corresponding threshold level is $-2z/3$, so that the following relational expression is obtained: $C_2\cdot-(2+\sigma)=-2z/3$. Therefore, in response to the signal distribution parameter including the average value μ and the standard deviation σ, $\mu=2z/(3\cdot C_1)$, and $$\sigma = \frac{2z}{3\cdot C_2} - \mu = \frac{2z}{3C_2} - \frac{2z}{3C_1}.$$

A sequence of determining $C_1$ and $C_2$ is not limited in at least one embodiment. $C_1$ and $C_2$ is the same or is different.

In an implementation, a quantity of first scaling multiples included in the first scaling multiple set is related to a quantity of types of quantization levels. Specifically, the receiving end learns, based on the quantity of types of quantization levels, of a quantity of first scaling multiples that are to be determined at least. For example, in response to N=2, the first scaling multiple set at least includes one first scaling multiple. In response to N=4, the first scaling multiple set at least includes two first scaling multiples. In response to N=8, the first scaling multiple set at least includes three first scaling multiples.

Step S303: Determine N types of quantization levels based on the signal distribution parameter of the first signal, where N=4.

For an execution process of step S303, refer to the specific descriptions of step S202 in FIG. 2a. Details are not described herein again.

In FIG. 3b, an average value and a standard deviation of a first Gaussian distribution are respectively $\mu_1$ and $\sigma_1$, and an average value and a standard deviation of a second Gaussian distribution are respectively $\mu_2$ and $\sigma_2$, where $\mu_1\leq\mu_2$, $\mu_1=-\mu_2=-\mu$, and $\sigma_1=\sigma_2=\sigma$. Expressions of quantization levels is obtained by substituting the determined signal distribution parameters μ and σ into the foregoing expression (6):

$$q_r = \begin{cases} -\mu - a*\sigma, & y < -\mu \\ -\mu + a*\sigma, & -\mu \leq y < 0 \\ \mu - a*\sigma, & 0 \leq y < \mu \\ \mu + a*\sigma, & y \geq \mu \end{cases},$$

in other words, $$q_r = \begin{cases} -\frac{2z}{3C_1} - a*\left(\frac{2z}{3C_2} - \frac{2z}{3C_1}\right), & y < -\frac{2z}{3C_1} \\ -\frac{2z}{3C_1} + a*\left(\frac{2z}{3C_2} - \frac{2z}{3C_1}\right), & -\frac{2z}{3C_1} \leq y < 0 \\ \frac{2z}{3C_1} - a*\left(\frac{2z}{3C_2} - \frac{2z}{3C_1}\right), & 0 \leq y < \frac{2z}{3C_1} \\ \frac{2z}{3C_1} + a*\left(\frac{2z}{3C_2} - \frac{2z}{3C_1}\right), & y \geq \frac{2z}{3C_1} \end{cases} \quad (7)$$

Step S304: Determine the second signal based on the first signal.

In an implementation, after the receiving end receives the first signal, scaling processing is performed on the first signal based on a second scaling multiple to obtain the second signal, where the second scaling multiple is included in the first scaling multiple set. Optionally, the second scaling multiple is the foregoing $C_1$, in other words, the second scaling multiple is the first scaling multiple included in the expression ($\mu=2z/(3\cdot C_1)$) of the average value pt. For the rest of an execution process of step S304, refer to the specific descriptions of step S203 in FIG. 2a. Details are not described herein again.

Step S305: Perform quantization processing on the second signal to obtain x groups of first quantization results, where the x symbols are in one-to-one correspondence with the x groups of first quantization results.

Step S306: Map the x groups of first quantization results to a quantized first signal, where the quantized first signal includes x quantization levels, and each group of first quantization results is mapped to one of the N types of quantization levels.

Step S307: Perform signal processing on the quantized first signal.

For an execution process of steps S305 to S307, refer to specific descriptions of steps S204 to S206 in FIG. 2a. Details are not described herein again.

Figure 3C:
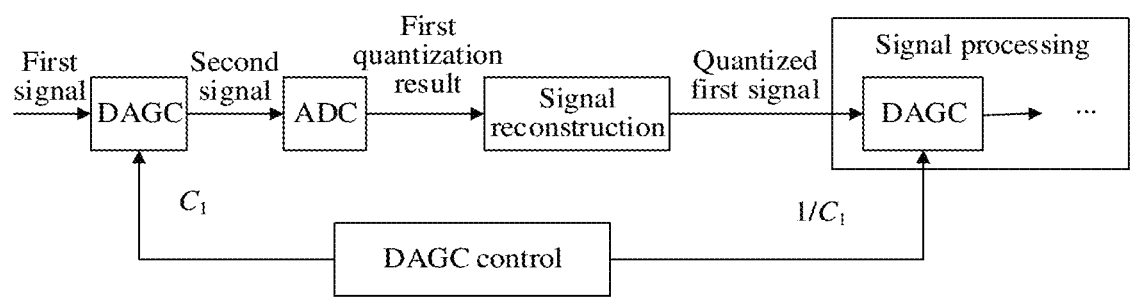
FIG. 3c is a schematic diagram of a first signal processing procedure according to at least one embodiment.

In response to the second signal being obtained by the receiving end by performing scaling processing on the first signal based on the second scaling multiple, after the quantized first signal is obtained, the receiving end performs scaling processing on the quantized first signal based on a reciprocal of the second scaling multiple. An example in which the second scaling multiple is $C_1$ is used. After the receiving end receives the first signal, a processing procedure of the first signal is shown in FIG. 3c. The receiving end controls an amplification multiple of the DAGC via a DAGC control module. An ADC is configured to perform quantization processing on the second signal. The performing signal processing on the quantized first signal includes: performing scaling processing on the quantized first signal based on $1/C_1$. In another implementation, after scaling processing is performed on the quantized first signal based on $1/C_1$, subsequent signal processing, for example, baseband signal processing and application layer processing, is further performed, which is not shown in FIG. 3c. In FIG. 3c, the DAGC control module notifies a signal processing module of $1/C_1$, so that the DAGC in the signal processing module performs scaling processing on the quantized first signal based on $1/C_1$, and this is merely used as an example. In another implementation, the DAGC control module further notifies a signal reconstruction module of $1/C_1$, so that after obtaining the quantized first signal, the signal reconstruction module performs scaling processing on the quantized first signal based on $1/C_1$.

In at least one embodiment, the signal distribution parameter of the first signal represents a distribution of amplitudes of the first signal, and the N types of quantization levels are determined based on the signal distribution parameter of the first signal, so that a difference between the quantized first signal and the first signal before quantization is relatively small, that is, a quantization error is reduced.

FIG. 4a is a schematic flowchart of still another signal processing method according to at least one embodiment. The method describes in detail how to adjust a first signal. Step S401 to step S408 are performed by a receiving end, or a chip in the receiving end. The following uses an example in which the receiving end performs the signal processing method for description. As shown in FIG. 4a, the method includes but is not limited to the following steps.

Step S401: Receive the first signal, where the first signal includes x symbols, and x≥1.

Step S402: Determine N types of quantization levels based on a signal distribution parameter of the first signal, where optionally, N=4 or 8.

For an execution process of steps S401 and S402, refer to specific descriptions of steps S201 and S202 in FIG. 2a. Details are not described herein again. The receiving end further determines the signal distribution parameter of the first signal by using a first scaling multiple set. For details, refer to the descriptions in step S302 in FIG. 3a. Details are not described herein again.

Step S403: In response to the first signal not meeting a second condition, determine an adjustment parameter and a third scaling multiple based on the signal distribution parameter of the first signal.

In at least one embodiment, after receiving the first signal, the receiving end determines whether the first signal meets the second condition. In response to the first signal not meeting the second condition, the receiving end determines the adjustment parameter and the third scaling multiple based on the signal distribution parameter of the first signal. The adjustment parameter is for adjusting the first signal, so that an adjusted first signal meets the second condition, and the third scaling multiple is for performing scaling processing on the adjusted first signal. In response to the second condition being met, the second signal is determined based on the first signal, and uniform quantization processing is further performed on the second signal. Optionally, in response to a distribution of amplitudes of the first signal being represented by a weighted sum of M first distributions, and a relationship between a quantity N of types of quantization levels and M is $N \leq 2^{[(log_2 M)+1]}$, after receiving the first signal, the receiving end determines whether the first signal meets the second condition. In response to the first signal not meeting the second condition, the receiving end determines the adjustment parameter and the third scaling multiple based on the signal distribution parameter of the first signal.

Figure 4B:
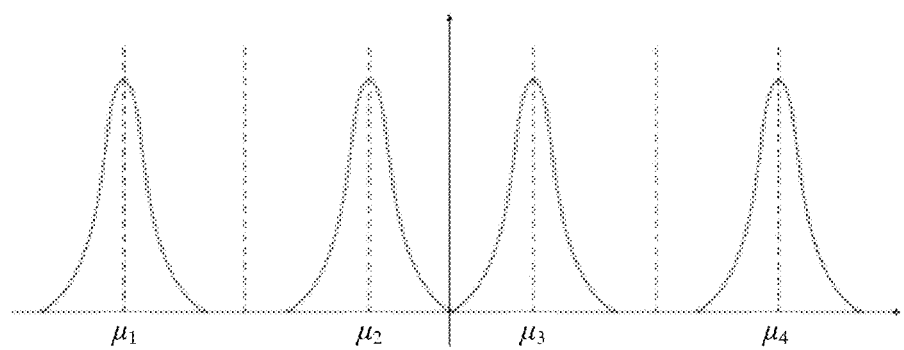
FIG. 4b is a schematic diagram of probability density curves of a mixed Gaussian distribution including four Gaussian distributions.

In response to the distribution of the amplitudes of the first signal being represented by the weighted sum of the M first distributions, in response to M≥2, whether the first signal meets the second condition means whether average values of the M first distributions obey a uniform distribution, in other words, whether intervals between adjacent average values in the average values of the M first distributions are the same. For example, the first distribution is a Gaussian distribution, and M=4. FIG. 4b is a schematic diagram of probability density curves of a mixed Gaussian distribution including four Gaussian distributions. $\mu_1$, $\mu_2$, $\mu_3$, and $\mu_4$ are average values of the four Gaussian distributions, and from FIG. 4b $\mu_1 \leq \mu_2 \leq \mu_3 \leq \mu_4$, $\mu_1 = -\mu_4$, $\mu_2 = -\mu_3$, and $\sigma_1 = \sigma_2 = \sigma_3 = \sigma_4$, but an interval between $\mu_2$ and $\mu_3$ and an interval between $\mu_3$ and $\mu_4$ are different. In response to the distribution of the amplitudes of the first signal being represented by a weighted sum of the four Gaussian distributions, the first signal does not meet the second condition in this case. In response to M=2, whether the first signal meeting the second condition means whether absolute values of the average values of the M first distributions are equal, in other words, whether the M first distributions are two distributions whose positive and negative parts are symmetric.

Step S404: Adjust the first signal based on the adjustment parameter, where the adjusted first signal meets the second condition.

After determining the adjustment parameter and the third scaling multiple, the receiving end adjusts the first signal based on the adjustment parameter, where the adjusted first signal meets the second condition. That the adjusted first signal meets the second condition includes: A distribution of amplitudes of the adjusted first signal is represented by the weighted sum of M first distributions, and average values of the M (M≥2) first distributions obey a uniform distribution or absolute values of average values of the M (M=2) first distributions are equal. In response to the adjusted first signal meeting the second condition, the receiving end quantizes the adjusted first signal in a uniform quantization manner, so that quantization noise is relatively small.

In an implementation, the first signal y is adjusted according to the following formula, to obtain an adjusted first signal y*:

$$y^* = \text{sign}(y) \cdot (|y| + \Delta\mu) \quad (8)$$

In the formula (8), sign(y) represents a sign of y. For example, in FIG. 4b, a sign of two Gaussian distributions on the left is "−", and a sign of two Gaussian distributions on the right is "+". $\Delta\mu$ is the adjustment parameter. Formula (8) indicates that a part whose sign is "−" in the first signal y is translated leftwards by $\Delta\mu$, and a part whose sign is "+" in the first signal y is translated rightwards by $\Delta\mu$.

Figure 4C:
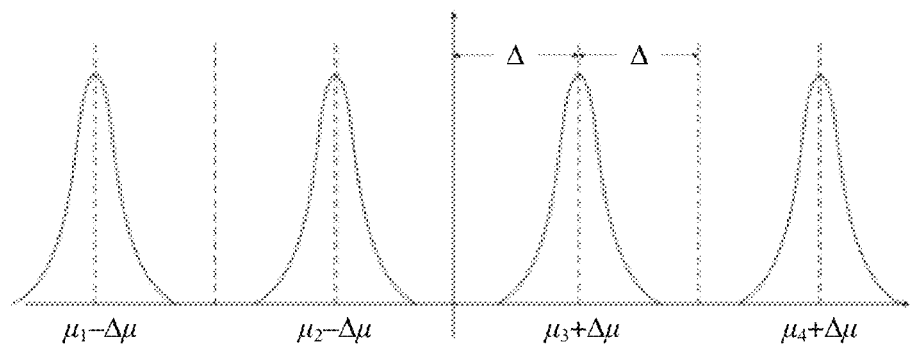
FIG. 4c is a schematic diagram of probability density curves that is used to represent a mixed Gaussian distribution of an adjusted first signal.

For example, in response to the amplitudes of the first signal being represented by the mixed Gaussian distribution shown in FIG. 4b, the first signal is adjusted according to formula (8), and the adjusted first signal is represented by a mixed Gaussian distribution shown in FIG. 4c. To enable the adjusted first signal to meet the second condition, a relational expression (9) is to be satisfied:

$$3(\mu_3 + \Delta\mu) = (\mu_4 + \Delta\mu) \text{ or } 3(\mu_2 - \Delta\mu) = (\mu_1 - \Delta\mu) \quad (9)$$

An expression (10) of the adjustment parameter is obtained according to the relational expression (9):

$$\Delta\mu = (\mu_4 - 3\mu_3)/2 \text{ or } \Delta\mu = (3\mu_2 - \mu_1)/2 \quad (10)$$

In the expression (10), $\mu_1 = -\mu_4$ and $\mu_2 = -\mu_3$, where $\mu_1$, $\mu_2$, $\mu_3$, and $\mu_4$ is determined based on the first scaling multiple set. For example, in response to amplitudes of a reference signal of the first signal being represented by a mixed Gaussian distribution including the four Gaussian distributions shown in FIG. 4b, from a Gaussian distribution theorem: $P(|y| \geq \mu_4) = 0.5/2 = 0.25$, $P(|y| \geq \mu_4 + \sigma_4) = 0.1587/2 = 0.07935$, and $P(0 \leq |y| \leq \mu_3) = 0.5/2 = 0.25$. Assuming that 3-bit uniform quantization processing is performed on a third signal y3' determined based on a reference signal y3 of the first signal, threshold levels are $\{-6z/7, -4z/7, -2z/7, 0, 2z/7, 4z/7, 6z/7\}$, and eight types of obtained quantization results are shown in expression (11).

$$Q(y3') = \begin{cases} 000, & y < \mu_1 \\ 001, & \mu_1 \leq y < \dfrac{\mu_1 + \mu_2}{2} \\ 010, & \dfrac{\mu_1 + \mu_2}{2} \leq y < \mu_2 \\ 011, & \mu_2 \leq y < 0 \\ 100, & 0 \leq y < \mu_3 \\ 101, & \mu_3 \leq y < \dfrac{\mu_3 + \mu_4}{2} \\ 110, & \dfrac{\mu_3 + \mu_4}{2} \leq y < \mu_4 \\ 111, & y \geq \mu_4 \end{cases} \quad (11)$$

A process of determining the first scaling multiple set is similar to step S203. The following briefly describes the process. For a detailed process, refer to the foregoing descriptions. A difference lies in that N=8 herein. Therefore, three first scaling multiples is to be determined at least.

(1) A DAGC scaling multiple is $C_{11}$, and a probability of obtaining {000,111} by performing uniform quantization processing on y3' is approximately 0.25, where the third signal y3'=$C_{11}$·y3 is obtained by performing scaling processing on the reference signal y3. In this case, the first scaling multiple set includes $C_{11}$. Because $P(|y| \geq \mu_4) = 0.5/2 = 0.25$, the following relational expression is obtained: $C_{11} \cdot \mu_4 = 6z/7$. Therefore, in response to the signal distribution parameter including the average value $\mu_4$, $\mu_4 = 6z/(7 \cdot C_{11})$.

(2) A DAGC scaling multiple is $C_{22}$, and a probability of obtaining {011,100} by performing uniform quantization processing on y3' is approximately 0.25, where the third signal y3'=$C_{22}$ y3 is obtained by performing scaling processing on the reference signal y3. In this case, the first scaling multiple set includes $C_{11}$ and $C_{22}$. Because $P(0 \leq |y| \leq \mu_3) = 0.5/2 = $ the following relational expression is obtained: $C_{11} \cdot \mu_3 = 2z/7$. Therefore, in response to the signal distribution parameter including the average value $\mu_3$, $\mu_3 = 2z/(7 \cdot C_{22})$.

(3) A DAGC scaling multiple is $C_{33}$, and a probability of obtaining {000,111} by performing uniform quantization processing on y3' is approximately 0.07935, where the third signal y3'=$C_{33}$ y3 is obtained by performing scaling processing on the reference signal y3. In this case, the first scaling multiple set includes $C_{11}$, $C_{22}$, and $C_{33}$. Because $P(|y| \geq \mu_4 + \sigma_4) = 0.1587/2 = 0.07935$, the following relational expression is obtained: $C_{33} \cdot (\mu_4 + \sigma_4) = 6z/7$. Therefore, in response to the signal distribution parameter including the average value $\mu_4$ and $\sigma_4$, $\mu_4 + \sigma_4 = 6z/(7 \cdot C_{33})$.

According to the foregoing (1) to (3), expressions of $\mu_3$, $\mu_4$, and $\sigma_4$ is determined, in other words, expressions of $\mu_1$, $\mu_2$, $\sigma_1$, $\sigma_2$, and $\sigma_3$ is determined.

Step S405: Perform scaling processing on the adjusted first signal based on the third scaling multiple, to obtain the second signal.

A process of determining the third scaling multiple by the receiving end is similar to a process of determining the first scaling multiple, and is specifically: The receiving end adjusts the DAGC scaling multiple, where for example, an adjusted scaling multiple is a third scaling multiple $C_{44}$, so that $C_{44} \cdot (\mu_4 + \Delta\mu) = 6z/7$. $\Delta\mu = (\mu_4 - 3\mu_3)/2$ is substituted to obtain $C_{44} = 6z/[7(2\mu_4 - \mu_3)]$.

Step S406: Perform quantization processing on the second signal to obtain x groups of first quantization results, where the x symbols are in one-to-one correspondence with the x groups of first quantization results.

Step S407: Map the x groups of first quantization results to a quantized first signal, where the quantized first signal includes x quantization levels, and each group of first quantization results is mapped to one of the N types of quantization levels.

Step S408: Perform signal processing on the quantized first signal.

For an execution process of steps S406 to S408, refer to specific descriptions of steps S204 to S206 in FIG. 2a. Details are not described herein again.

In at least one embodiment, in response to the first signal not meeting the second condition, the first signal is adjusted based on the adjustment parameter, so that the adjusted first signal meets the second condition. Further, the receiving end quantizes the adjusted first signal in a uniform quantization manner, and this helps reduce quantization noise.

The foregoing embodiments in FIG. 2a to FIG. 4a are applicable to a case in which a channel for transmitting the first signal is an additive white Gaussian noise (additive white Gaussian noise, AWGN) channel or is approximately the AWGN channel. An AWGN is a most basic noise and interference model, an amplitude distribution of the AWGN obeys a Gaussian distribution, and power spectral density is uniformly distributed. The AWGN means that compared with a sent signal, a received signal has no distortion except the additive white Gaussian noise.

Figure 5B:
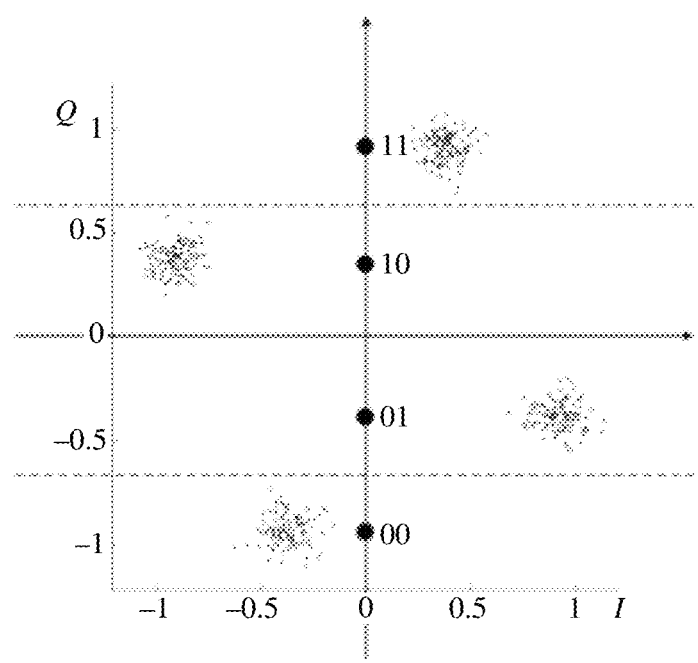
FIG. 5b is a constellation diagram of a first signal received by a receiving end in response to a transmission phase of the first signal on a channel changing.
Figure 6:
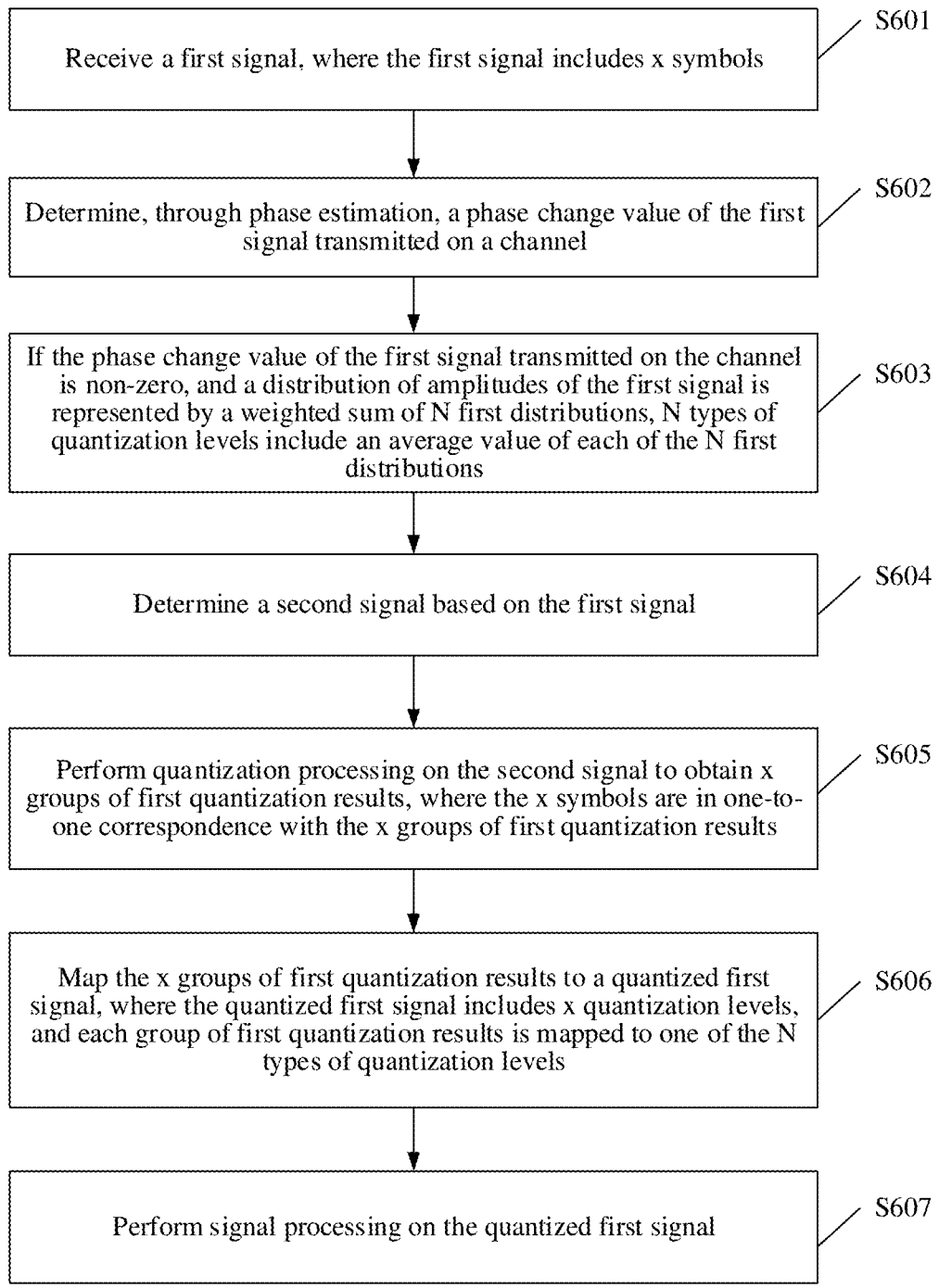
FIG. 6 is a schematic flowchart of still yet another signal processing method according to at least one embodiment.

Embodiments in FIG. 5a to FIG. 6 are applicable to a case in which a channel for transmitting a first signal is a non-AWGN channel. In embodiments in FIG. 5a to FIG. 6, a transmission phase of the first signal on the channel changes, and this causes a change in a distribution of the first signal. For example, in response to the transmission phase of the first signal on the channel not changing, a constellation diagram of the first signal received by a receiving end is shown in FIG. 1a; in response to the transmission phase of the first signal on the channel changing, a constellation diagram of the first signal received by a receiving end is shown in FIG. 5b. The embodiment in FIG. 5a describes how to perform phase compensation on the first signal to offset impact of the phase on the first signal. The embodiment in FIG. 6 describes the following case: In response to the transmission phase of the first signal on the channel changing, a receiving end does not perform phase compensation on the first signal, but designs quantization levels to enable a quantization error to be relatively small.

FIG. 5a is a schematic flowchart of yet another signal processing method according to at least one embodiment. The method describes in detail how to determine a phase change value of the first signal transmitted on the channel, to perform phase compensation on the first signal. Step S501 to step S508 are performed by a receiving end, or a chip in the receiving end. The following uses an example in which the receiving end performs the signal processing method for description. As shown in FIG. 5a, the method includes but is not limited to the following steps.

Step S501: Receive the first signal, where the first signal includes x symbols, and x≥1.

For an execution process of step S501, refer to the specific descriptions of step S201 in FIG. 2a. Details are not described herein again.

Step S502: Determine, through phase estimation, the phase change value of the first signal transmitted on the channel.

In at least one embodiment, the receiving end performs phase estimation based on a preamble sequence. Optionally, phase estimation is performed based on a preamble sequence having uniformly distributed phases, so that unbiased estimation is implemented.

Specifically, the preamble sequence having uniformly distributed phases is obtained according to the following method: First, any known sequence (for example, referred to as an original preamble sequence) $c=[c_0, c_1, \ldots, c_{L-1}]$ is generated. The sequence is a single-carrier QAM modulation sequence, for example, any 4QAM sequence, or is a Gray sequence, a Zadoff-Chu sequence, or the like. L is a quantity of elements included in the sequence. Then, point multiplication is performed on the original preamble sequence and a random phase sequence $\varphi=[\varphi_0, \varphi_1, \ldots, \varphi_{L-1}]$, and an element $\varphi_k$ in $\varphi$ obeys an independent and identical distribution, that is, $\varphi_k \sim U[-\pi, \pi]$. In this way, a distribution of phases of elements in a preamble sequence obtained through the point multiplication is a uniform distribution of $[-\pi, \pi]$. That is, the preamble sequence that is used for phase estimation and that has uniformly distributed phases is $p=[p_k]=[c_k \cdot \varphi_k]$, where $k=0, 1, \ldots, L-1$. In a random process, values at any moment are random variables. In response to these random variables obeying a same distribution and being independent of each other, these random variables obey an independent and identical distribution.

The transmitting end sends the preamble sequence p. Correspondingly, a preamble sequence received by the receiving end is $r=[r_0, r_1, \ldots, r_{L-1}]$ r is a quantized preamble sequence, and is a preamble sequence obtained through multi-bit quantization (for example, 2-bit quantization), or is a preamble sequence obtained through 1-bit quantization. 1-bit quantization is quantization that considers only positive and negative signs. The receiving end performs phase estimation according to the following formula (12):

$$\theta = \text{angle}(\Sigma_{k=0}^{L-1} p^*_k \cdot r_k) \qquad (12)$$

In the formula (12), θ is an estimated phase change value of the preamble sequence p transmitted on the channel; angle (·) represents a phase collection operation; an element $\varphi_k$ is a complex number; and (·)* represents a conjugate. Regardless of whether r is the preamble sequence obtained through 2-bit quantization or the preamble sequence obtained through 1-bit quantization, the receiving end performs phase estimation according to the formula (12).

In at least one embodiment, the phase change value of the preamble sequence p transmitted on the channel is the same as the phase change value of the first signal transmitted on the channel Therefore, phase compensation is performed, by using θ, on the first signal received by the receiving end.

Step S503: Perform phase compensation on the first signal based on the phase change value.

After determining the phase change value of the first signal transmitted on the channel, the receiving end performs phase compensation on the first signal based on the phase change value.

In an implementation, in response to the phase change value being greater than a preset phase value, the receiving end performs phase compensation on the first signal based on the phase change value; in response to the phase change value being less than or equal to a preset phase value, the receiving end does not perform phase compensation on the first signal. The preset phase value is preset by the receiving end (for example, set by experience), or agreed on in a protocol. Optionally, the preset phase value is 0.

Step S504: Perform scaling processing on a first signal obtained through the phase compensation, to obtain a second signal.

After performing phase compensation on the first signal, the receiving end performs scaling processing on the first signal obtained through the phase compensation, to obtain the second signal. For example, scaling processing is performed, based on a second scaling multiple, on the first signal obtained through the phase compensation, to obtain the second signal. For related content of the second scaling multiple, refer to the descriptions in step S304 in FIG. 3a.

Step S505: Determine N types of quantization levels based on a signal distribution parameter of the first signal, where for example, N=4.

In response to a transmission phase of the first signal on the channel changing, the quantization levels shown in the foregoing expressions (7) is replaced by expressions (13):

$$q_r = \begin{cases} -\mu - a \cdot \delta, & y < -\mu \\ -\mu + a \cdot \delta, & -\mu \le y < 0 \\ \mu - a \cdot \delta, & 0 \le y < \mu \\ \mu + a \cdot \delta, & y \ge \mu \end{cases} \qquad (13)$$

In response to the phase change value of the first signal transmitted on the channel being greater than the preset phase value, in the expression (13), $\delta=0.675\sigma$. Preferably, $$a = a_1 = \sqrt{\frac{2}{\pi}} \cdot \frac{1}{0.675} = 1.1821.$$

In response to the phase change value being less than or equal to the preset phase value, $\delta=\mu_4-\mu$. Optionally, $a=a_2=1$.

Optionally, interpolation such as linear interpolation is performed to determine a value of the coefficient a.

For a remaining execution process of step S505, refer to the descriptions in the foregoing embodiments. The receiving end further determines the signal distribution parameter of the first signal by using a first scaling multiple set. For details, refer to the descriptions in step S302 in FIG. 3a. Details are not described herein again.

Step S506: Perform quantization processing on the second signal to obtain x groups of first quantization results, where the x symbols are in one-to-one correspondence with the x groups of first quantization results.

Step S507: Map the x groups of first quantization results to a quantized first signal, where the quantized first signal includes x quantization levels, and each group of first quantization results is mapped to one of the N types of quantization levels.

Step S508: Perform signal processing on the quantized first signal.

For the rest of an execution process of step S506 to S508, refer to the specific descriptions of step S202 in FIG. 2a. Details are not described herein again.

In at least one embodiment, the transmission phase of the first signal on the non-AWGN channel changes, and consequently, the distribution of the first signal changes. The phase change value of the first signal transmitted on the channel is determined through phase estimation, and phase compensation is performed on the first signal based on the phase change value. This helps offset the impact of the phase on the first signal.

FIG. 6 is a schematic flowchart of still yet another signal processing method according to at least one embodiment. In the method, expressions, of the quantization levels, used in response to phase compensation not being performed on the first signal is described in detail. Step S601 to step S607 are performed by a receiving end, or a chip in the receiving end. The following uses an example in which the receiving end performs the signal processing method for description. As shown in FIG. 6, the method includes but is not limited to the following steps.

Step S601: Receive the first signal, where the first signal includes x symbols, and x≥1.

Step S602: Determine, through phase estimation, a phase change value of the first signal transmitted on a channel.

For a process of performing step S601, refer to the specific descriptions of step S201 in FIG. 2a. For a process of performing step S602, refer to the specific descriptions of step S502 in FIG. 5a. Details are not described herein again.

Step S603: In response to the phase change value of the first signal transmitted on the channel being non-zero, and a distribution of amplitudes of the first signal is represented by a weighted sum of N first distributions, N types of quantization levels include an average value of each of the N first distributions.

In an implementation, in response to a terminal device not performing phase compensation on the first signal, $\delta=\mu_4-\mu$ is substituted into the expressions (13) to obtain:

$$q_r = \begin{cases} -\mu_4, & y < -\mu \\ \mu_4 - 2\mu, & -\mu \leq y < 0 \\ 2\mu - \mu_4, & 0 \leq y < \mu \\ \mu_4, & y \geq \mu \end{cases} \quad (14)$$

$\mu=(\mu_4+\mu_3)/2$, $\mu_1=-\mu_4$, and $\mu_2=-\mu_3$ are substituted into the expressions (14) to obtain:

$$q_r = \begin{cases} -\mu_4 = \mu_1, & y < -\mu \\ -\mu_3 = \mu_2 - \mu, & -\mu \leq y < 0 \\ \mu_3, & 0 \leq y < \mu \\ \mu_4, & y \geq \mu \end{cases} \quad (15)$$

The expressions (15) are expressions, of the quantization levels, used in response to the quantization levels including four types and the distribution of the amplitudes of the first signal being represented by a weighted sum of four (namely, N=4) Gaussian distributions.

In response to the phase change value being non-zero, in response to a total quantity N of quantization levels being the same as a quantity N of first distributions indicating the distribution of the amplitudes of the first signal, and average values of the N first distributions being respectively $\mu_1$, $\mu_2$, . . . , $\mu_{N-1}$, and $\mu_N$, where $\mu_1 \leq \mu_2 \leq \ldots \leq \mu_{N-1} \leq \mu_N$, expressions of the N types of quantization levels are:

$$q_r = \begin{cases} \mu_1 \\ \mu_2 \\ \vdots \\ \mu_{N-1} \\ \mu_N \end{cases} \quad (16)$$

For example, N=4, and the first distribution is a Gaussian distribution. In response to a constellation diagram of the first signal received by the receiving end shown in FIG. 5b, the quantization levels are average values of the four Gaussian distributions. From FIG. 5b, values of the first signal received by the receiving end is distributed near four constellation points, and the four types of quantization levels are the average values of the four Gaussian distributions, so that quantization noise is relatively small, and the quantization noise obeys or approximately obeys the Gaussian distribution.

The receiving end determines a signal distribution parameter (namely, $\mu_1, \mu_2, \ldots, \mu_N$) of the first signal by using a first scaling multiple set. For details, refer to the descriptions in step S302 in FIG. 3a. Details are not described herein again.

Step S604: Determine a second signal based on the first signal.

For an execution process of step S604, refer to the specific descriptions of step S203 in FIG. 2a or step S304 in FIG. 3a. Details are not described herein again.

Step S605: Perform quantization processing on the second signal to obtain x groups of first quantization results, where the x symbols are in one-to-one correspondence with the x groups of first quantization results.

Step S606: Map the x groups of first quantization results to a quantized first signal, where the quantized first signal includes x quantization levels, and each group of first quantization results is mapped to one of the N types of quantization levels.

Step S607: Perform signal processing on the quantized first signal.

For an execution process of steps S605 to S607, refer to specific descriptions of steps S204 to S206 in FIG. 2a. Details are not described herein again.

In at least one embodiment, in response to the phase change value of the first signal transmitted on the channel being non-zero, and the distribution of the amplitudes of the first signal being represented by the weighted sum of the N first distributions, the N types of quantization levels are designed to include the average value of each of the N first distributions, so that the quantization noise is relatively small.

The following describes block error rate (block error rate, BLER) performance of the signal processing method in the foregoing embodiment as an example.

A receiving end uses a 2-bit ADC, a first signal is a signal whose modulation scheme is 4QAM, bit rates are the following three types: {0.5, 0.75, 0.8125}, a polar code is used for channel encoding, and a channel is an 802.11ay standard channel model. In the foregoing assumed conditions, the receiving end separately processes the first signal by using the conventional quantization solution and the signal processing method (namely, the solution of at least one embodiment) in the foregoing embodiment, and a BLER performance comparison diagram is shown in FIG. 7 based on a simulation experiment.

Figure 7:
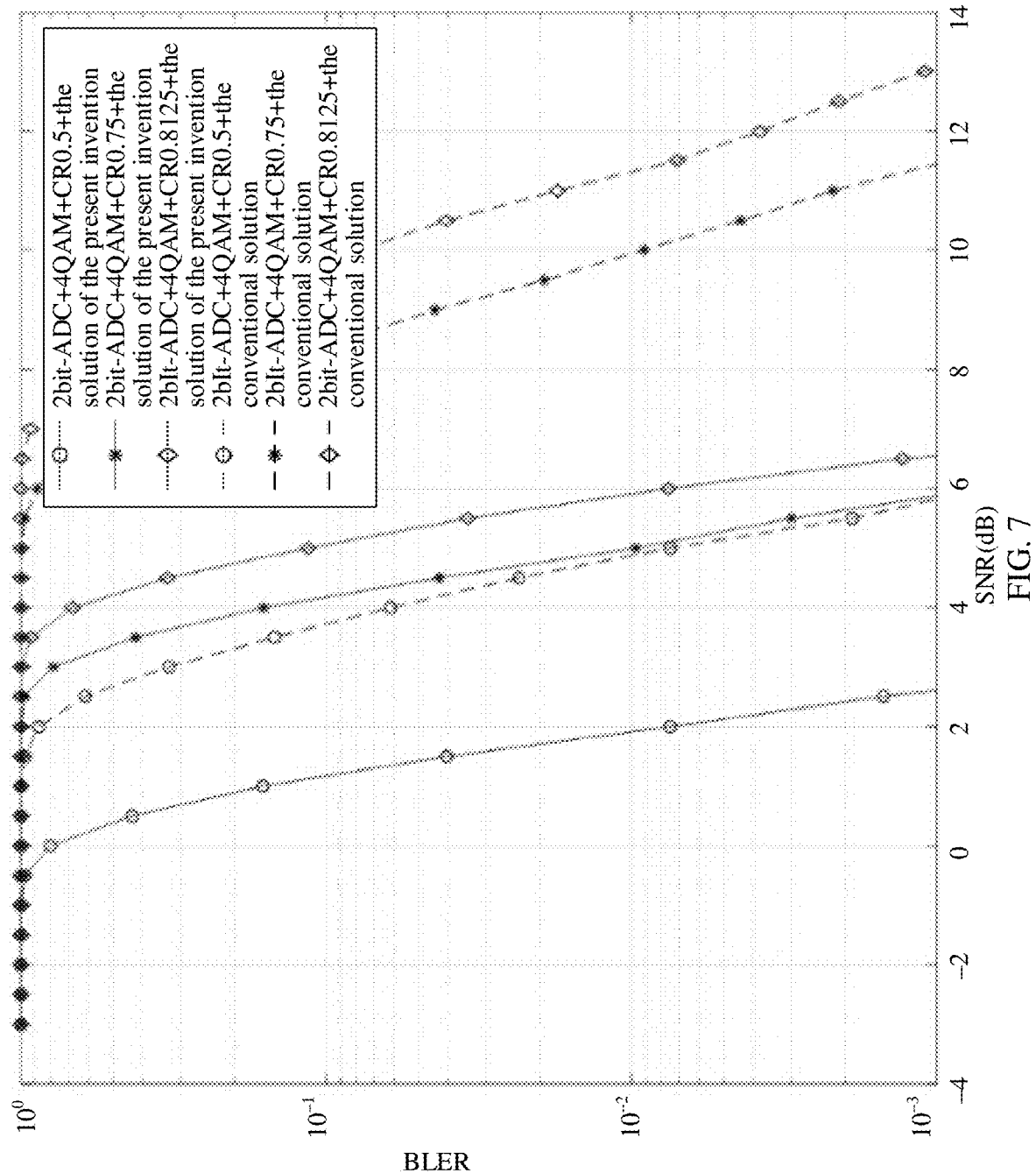
FIG. 7 is a BLER performance comparison diagram.

From FIG. 7 that, compared with the conventional solution, the solution of the embodiments described herein greatly improve BLER performance.

In the foregoing embodiments described herein, the method provided in at least one embodiment is described. To implement functions in the method provided in at least one embodiment, the receiving end includes a hardware structure and a software module, and implement the foregoing functions in a form of the hardware structure, the software module, or the hardware structure and the software module. One of the foregoing functions is performed by using the hardware structure, the software module, or the combination of the hardware structure and the software module.

Figure 8:
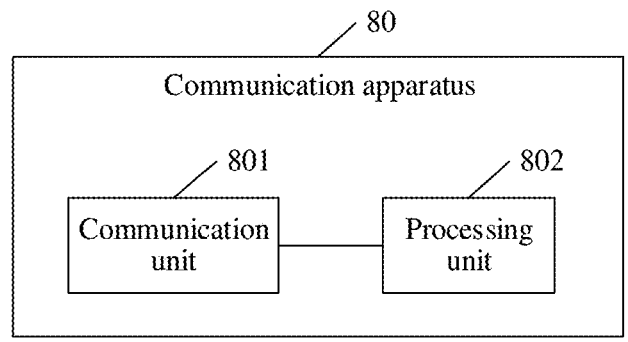
FIG. 8 is a schematic diagram of a structure of a communication apparatus according to at least one embodiment.

FIG. 8 is a schematic diagram of a structure of a communication apparatus 80 according to at least one embodiment. As shown in FIG. 8, the communication apparatus 80 includes a communication unit 801 and a processing unit 802. The communication unit 801 includes a communication interface such as a sending unit and/or a receiving unit. The sending unit is configured to implement a sending function, the receiving unit is configured to implement a receiving function, and the communication unit 801 implements a sending function and/or a receiving function. The communication unit is also described as a transceiver unit.

The communication apparatus 80 is a receiving end, or is an apparatus in the receiving end, or is an apparatus that is used together with the receiving end. The receiving end is a terminal device or a network device.

The communication unit 801 is configured to receive a first signal, where the first signal includes x symbols.

The processing unit 802 is configured to: determine N types of quantization levels based on a signal distribution parameter of the first signal; determine a second signal based on the first signal; perform quantization processing on the second signal to obtain x groups of first quantization results; map the x groups of first quantization results to a quantized first signal, where the quantized first signal includes x quantization levels; and perform signal processing on the quantized first signal, where the x symbols are in one-to-one correspondence with the x groups of first quantization results, and each group of first quantization results is mapped to one of the N types of quantization levels, where N≥2 and x≥1.

In an implementation, the processing unit 802 is further configured to: determine the signal distribution parameter of the first signal by using a first scaling multiple set of a digital automatic gain control DAGC.

In an implementation, the processing unit 802 is further configured to: perform, via the DAGC, scaling processing on a reference signal of the first signal, and perform quantization processing on a reference signal obtained through the scaling processing, to obtain second quantization results, where the first scaling multiple set includes: a scaling multiple for performing scaling processing on the reference signal in response to the second quantization results meeting a first condition.

In an implementation, that the second quantization results meet a first condition includes that a value of a probability that the second quantization results include a preset bit sequence is within a preset probability value interval.

In an implementation, in response to the processing unit 802 being configured to determine the second signal based on the first signal, the processing unit is specifically configured to: perform scaling processing on the first signal based on a second scaling multiple to obtain the second signal, where the second scaling multiple is included in the first scaling multiple set.

In an implementation, the processing unit 802 is further configured to: in response to the first signal not meeting a second condition, determine an adjustment parameter and a third scaling multiple based on the signal distribution parameter of the first signal; and in response to the processing unit 802 being configured to determine a second signal based on the first signal, the processing unit is specifically configured to: adjust the first signal based on the adjustment parameter, where an adjusted first signal meets the second condition; and perform scaling processing on the adjusted first signal based on the third scaling multiple, to obtain the second signal.

In an implementation, that an adjusted first signal meets the second condition includes: a distribution of amplitudes of the adjusted first signal is represented by a weighted sum of M first distributions, and average values of the M first distributions obey a uniform distribution or absolute values of the average values of the M first distributions are equal, where M≥2.

In an implementation, the processing unit 802 is further configured to: determine, through phase estimation, a phase change value of the first signal transmitted on a channel; and in response to the processing unit 802 being configured to determine the second signal based on the first signal, the processing unit is specifically configured to: perform phase compensation on the first signal based on the phase change value; and perform scaling processing on a first signal obtained through the phase compensation, to obtain the second signal.

In an implementation, in response to a phase change value of the first signal transmitted on a channel being non-zero, and a distribution of amplitudes of the first signal is represented by a weighted sum of N first distributions, the N types of quantization levels include an average value of each of the N first distributions.

In an implementation, the distribution of the amplitudes of the first signal is represented by a weighted sum of K first distributions, and the signal distribution parameter of the first signal includes an average value of each of the K first distributions, where K≥2.

In an implementation, the signal distribution parameter of the first signal further includes a standard deviation of each of the K first distributions.

In an implementation, the first distribution is a Gaussian distribution.

In an implementation, the first signal is a single-carrier signal.

In response to the communication apparatus 80 being the receiving end, the communication apparatus 80 is configured to implement a function of the receiving end in embodiments corresponding to FIG. 2a to FIG. 6.

Figure 9:
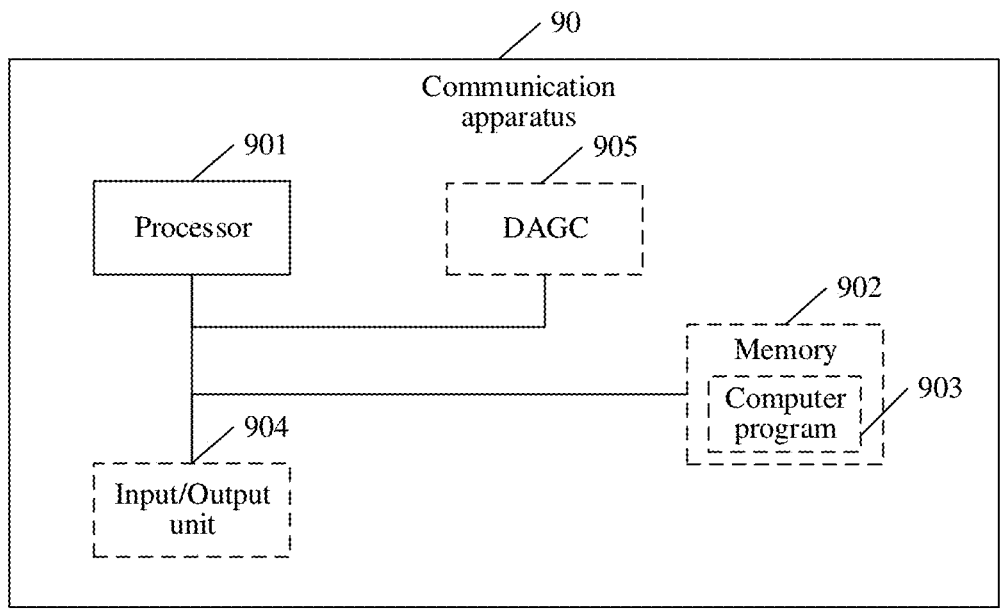
FIG. 9 is a schematic diagram of a structure of another communication apparatus according to at least one embodiment.

FIG. 9 is a schematic diagram of a structure of another communication apparatus 90 according to at least one embodiment. The communication apparatus 90 is a receiving end, or is a chip, a chip system, a processor, or the like that supports the receiving end in implementing the foregoing methods. The apparatus is configured to implement the methods described in the foregoing method embodiments. For details, refer to the descriptions in the foregoing method embodiments.

The communication apparatus 90 includes one or more processors 901. The processor 901 is a general-purpose processor, a dedicated processor, or the like. For example, the processor 901 is a baseband processor or a central processing unit. The baseband processor is configured to process a communication protocol and communication data, and the central processing unit is configured to control a communication apparatus (for example, a base station, a baseband chip, a terminal, a terminal chip, a DU, or a CU) to execute a computer program, to process data of the computer program.

Optionally, the communication apparatus 90 includes one or more memories 902, and the memory 902 stores a computer program 903. The computer program is run on the communication apparatus 90, so that the communication apparatus 90 performs the methods described in the foregoing method embodiments. Optionally, the memory 902 further stores data. A dashed-line box 902 in FIG. 9 indicates that the memory 902 is disposed independently, or is integrated with the processor 901. Optionally, the computer program 903 is further fixed in the processor 901.

Optionally, the communication apparatus 90 further includes an input/output unit 904. The input/output unit 904 includes but is not limited to the following implementation forms: an input/output interface, a transceiver unit, a transceiver machine, a transceiver, a transceiver circuit, or the like, and is configured to implement a transceiver function. The input/output unit 904 includes an input unit and an output unit. The input unit is a receiver, a receiver machine, a receiver circuit, or the like, and is configured to implement a receiving function. The output unit is a transmitter, a transmitter machine, an output circuit, a transmitter circuit, or the like, and is configured to implement an output function and/or a sending function. The input unit and the output unit that are configured to implement the receiving and sending functions is separated, or is integrated together. The input unit and the output unit is configured to read and write code/data, or is configured to transmit or transfer a signal. In an implementation, the input/output unit 904 is separately disposed, or is integrated with the processor 901, as shown in a dashed-line box 904 in FIG. 9.

Optionally, the communication apparatus further includes a digital automatic gain control DAGC (905). The DAGC (905) is configured to perform scaling processing on a signal. For example, the DAGC (905) performs scaling processing on a first signal to obtain a second signal. The DAGC (905) is an independent module, or is integrated with the processor 901, as shown in a dashed-line box 905 in the figure.

The input/output unit is configured to receive the first signal, where the first signal includes x symbols.

The processor 901 is configured to: determine N types of quantization levels based on a signal distribution parameter of the first signal; determine the second signal based on the first signal; perform quantization processing on the second signal to obtain x groups of first quantization results; map the x groups of first quantization results to a quantized first signal, where the quantized first signal includes x quantization levels; and perform signal processing on the quantized first signal, where the x symbols are in one-to-one correspondence with the x groups of first quantization results, and each group of first quantization results is mapped to one of the N types of quantization levels, where N≥2 and x≥1.

In an implementation, the processor 901 is further configured to: determine the signal distribution parameter of the first signal by using a first scaling multiple set of the digital automatic gain control DAGC (905).

In an implementation, the processor 901 is further configured to: perform, via the DAGC (905), scaling processing on a reference signal of the first signal, and perform quantization processing on a reference signal obtained through the scaling processing, to obtain second quantization results, where the first scaling multiple set includes: a scaling multiple for performing scaling processing on the reference signal in response to the second quantization results meeting a first condition.

In an implementation, that the second quantization results meet a first condition includes that a value of a probability that the second quantization results include a preset bit sequence is within a preset probability value interval.

In an implementation, in response to the processor 901 being configured to determine the second signal based on the first signal, the processor is specifically configured to: perform scaling processing on the first signal based on a second scaling multiple to obtain the second signal, where the second scaling multiple is included in the first scaling multiple set.

In an implementation, the processor 901 is further configured to: in response to the first signal not meeting a second condition, determine an adjustment parameter and a third scaling multiple based on the signal distribution parameter of the first signal; and in response to the processor 901 being configured to determine a second signal based on the first signal, the processor 901 is specifically configured to: adjust the first signal based on the adjustment parameter, where an adjusted first signal meets the second condition; and perform scaling processing on the adjusted first signal based on the third scaling multiple, to obtain the second signal.

In an implementation, that an adjusted first signal meets the second condition includes: a distribution of amplitudes of the adjusted first signal is represented by a weighted sum of M first distributions, and average values of the M first distributions obey a uniform distribution or absolute values of the average values of the M first distributions are equal, where M≥2.

In an implementation, the processor 901 is further configured to: determine, through phase estimation, a phase change value of the first signal transmitted on a channel; and in response to the processor 901 is configured to determine the second signal based on the first signal, the processor 901 is specifically configured to: perform phase compensation on the first signal based on the phase change value; and perform scaling processing on a first signal obtained through the phase compensation, to obtain the second signal.

In an implementation, in response to a phase change value of the first signal transmitted on a channel being non-zero, and a distribution of amplitudes of the first signal being represented by a weighted sum of N first distributions, the N types of quantization levels include an average value of each of the N first distributions.

In an implementation, the distribution of the amplitudes of the first signal is represented by a weighted sum of K first distributions, and the signal distribution parameter of the first signal includes an average value of each of the K first distributions, where K≥2.

In an implementation, the signal distribution parameter of the first signal further includes a standard deviation of each of the K first distributions.

In an implementation, the first distribution is a Gaussian distribution.

In an implementation, the first signal is a single-carrier signal.

In an implementation, the communication apparatus 90 includes a circuit, and the circuit implements the sending, receiving, or communication function in the foregoing method embodiments. The processor described in at least one embodiment is implemented in the following manners: an integrated circuit (integrated circuit, IC), an analog IC, a radio frequency integrated circuit RFIC, a mixed signal IC, an application-specific integrated circuit (application-specific integrated circuit, ASIC), a printed circuit board (printed circuit board, PCB), an electronic device, and the like. The processor is alternatively manufactured by using the following IC manufacturing technologies, for example, a complementary metal oxide semiconductor (complementary metal oxide semiconductor, CMOS), an n-channel metal oxide semiconductor (nMetal oxide semiconductor, NMOS), a p-channel metal oxide semiconductor (p-channel metal oxide semiconductor, PMOS), a bipolar junction transistor (bipolar junction transistor, BJT), a bipolar CMOS (BiCMOS), silicon germanium (SiGe), and gallium arsenide (GaAs).

The communication apparatus described in the foregoing embodiment is the receiving end. However, a scope of the communication apparatus described in at least one embodiment is not limited thereto, and a structure of the communication apparatus is not be limited by FIG. 9. The communication apparatus is an independent device or is a part of a large device. For example, the communication apparatus is:

(1) an independent integrated circuit IC, a chip, or a chip system or subsystem;
(2) a set including one or more ICs, where optionally, the set of ICs further includes a storage component configured to store data and a computer program;
(3) an ASIC such as a modem (Modem);
(4) a module that is embedded in another device;
(5) a receiver, a terminal, an intelligent terminal, a cellular phone, a wireless device, a handheld device, a mobile unit, a vehicle-mounted device, a network device, a cloud device, an artificial intelligence device, or the like; or
(6) others.

Figure 10:
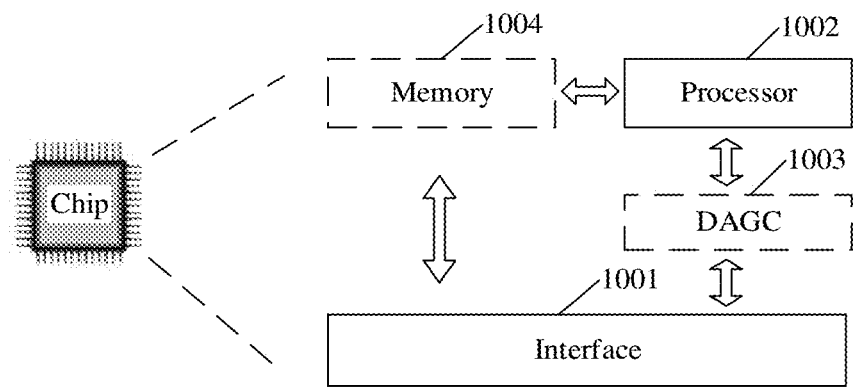
FIG. 10 is a schematic diagram of a structure of a chip according to at least one embodiment.

In response to the communication apparatus being a chip or a chip system, refer to a schematic diagram of a structure of a chip shown in FIG. 10. The chip shown in FIG. 10 includes an interface 1001 and a processor 1002. There is one or more interfaces 1001, and there is a plurality of processors 1002. Optionally, the chip further includes a digital automatic gain control DAGC (1003). The DAGC (1003) is configured to perform scaling processing on a signal. For example, the DAGC (1003) performs scaling processing on a first signal to obtain a second signal. The DAGC (1003) is an independent module, or is integrated with the processor 1002, as shown in a dashed-line box 1003 in FIG. 10.

The interface 1001 is configured to receive a first signal where the first signal includes x symbols.

The processor 1002 is configured to: determine N types of quantization levels based on a signal distribution parameter of the first signal; determine a second signal based on the first signal; perform quantization processing on the second signal to obtain x groups of first quantization results; map the x groups of first quantization results to a quantized first signal, where the quantized first signal includes x quantization levels; and perform signal processing on the quantized first signal, where the x symbols are in one-to-one correspondence with the x groups of first quantization results, and each group of first quantization results is mapped to one of the N types of quantization levels, where N≥2 and x≥1.

In an implementation, the processor 1002 is further configured to: determine the signal distribution parameter of the first signal by using a first scaling multiple set of the digital automatic gain control DAGC (1003).

In an implementation, the processor 1002 is further configured to: perform, via the DAGC (1003), scaling processing on a reference signal of the first signal, and perform quantization processing on a reference signal obtained through the scaling processing, to obtain second quantization results, where the first scaling multiple set includes: a scaling multiple for performing scaling processing on the reference signal in response to the second quantization results meeting a first condition.

In an implementation, that the second quantization results meet a first condition includes that a value of a probability that the second quantization results include a preset bit sequence is within a preset probability value interval.

In an implementation, in response to the processor 1002 being configured to determine the second signal based on the first signal, the processor is specifically configured to: perform scaling processing on the first signal based on a second scaling multiple to obtain the second signal, where the second scaling multiple is included in the first scaling multiple set. In an implementation, the processor 1002 is further configured to: in response to the first signal not meeting a second condition, determine an adjustment parameter and a third scaling multiple based on the signal distribution parameter of the first signal; and in response to the processor 1002 being configured to determine a second signal based on the first signal, the processor 1002 is specifically configured to: adjust the first signal based on the adjustment parameter, where an adjusted first signal meets the second condition; and perform scaling processing on the adjusted first signal based on the third scaling multiple, to obtain the second signal.

In an implementation, that an adjusted first signal meets the second condition includes: a distribution of amplitudes of the adjusted first signal is represented by a weighted sum of M first distributions, and average values of the M first distributions obey a uniform distribution or absolute values of the average values of the M first distributions are equal, where M≥2.

In an implementation, the processor 1002 is further configured to: determine, through phase estimation, a phase change value of the first signal transmitted on a channel; and in response to the processor 1002 being configured to determine the second signal based on the first signal, the processor 1002 is specifically configured to: perform phase compensation on the first signal based on the phase change value; and perform scaling processing on a first signal obtained through the phase compensation, to obtain the second signal.

In an implementation, in response to a phase change value of the first signal transmitted on a channel being non-zero, and a distribution of amplitudes of the first signal being represented by a weighted sum of N first distributions, the N types of quantization levels include an average value of each of the N first distributions.

In an implementation, the distribution of the amplitudes of the first signal is represented by a weighted sum of K first distributions, and the signal distribution parameter of the first signal includes an average value of each of the K first distributions, where K≥2.

In an implementation, the signal distribution parameter of the first signal further includes a standard deviation of each of the K first distributions.

In an implementation, the first distribution is a Gaussian distribution.

In an implementation, the first signal is a single-carrier signal.

Optionally, the chip further includes a memory 1004, and the memory 1004 is configured to store a computer program and data that are necessary. The memory 1004 is disposed independently, or is integrated with the processor 1002, as shown in a dashed-line box 1004 in FIG. 10.

A person skilled in the art further understands that various illustrative logical blocks (illustrative logic blocks) and steps (steps) that are listed in at least one embodiment is implemented by using electronic hardware, computer software, or a combination thereof. Whether the functions are implemented by using hardware or software depends on particular applications and a design specification of an entire system. A person skilled in the art is able to use various methods to implement the described functions for each particular application, but the implementation does not go beyond the scope of at least one embodiment.

At least one embodiment further provides a computer-readable storage medium. The computer-readable storage medium stores a computer program. The computer program includes program instructions. In response to the program instructions being executed by a computer, a function in any one of the foregoing method embodiments is implemented.

The computer-readable storage medium includes but is not limited to a flash memory, a hard disk, and a solid-state drive.

At least one embodiment further provides a computer program product. In response to the computer program product being executed by a computer, a function in any one of the foregoing method embodiments is implemented.

In some scenarios, some optional features in at least one embodiment is independently implemented without depending on another feature, for example, a solution on which the optional features are currently based, to resolve a corresponding technical problem and achieve a corresponding effect. Alternatively, in some scenarios, the optional features is combined with other features based on usage. Correspondingly, the apparatus provided in at least one embodiment also correspondingly implements these features or functions. Details are not described herein.

All or some of the foregoing embodiments is implemented through software, hardware, firmware, or any combination thereof. In response to the software being used to implement embodiments, all or some of embodiments is implemented in a form of a computer program product. The computer program product includes one or more computer programs. In response to the computer program being loaded and executed on a computer, the procedures or functions according to at least one embodiment are all or partially generated. The computer is a general-purpose computer, a dedicated computer, a computer network, or another programmable apparatus. The computer program is stored in a computer-readable storage medium or is transmitted from a computer-readable storage medium to another computer-readable storage medium. For example, the computer program is transmitted from a website, computer, server, or data center to another website, computer, server, or data center in a wired (for example, a coaxial cable, an optical fiber, or a digital subscriber line (digital subscriber line, DSL)) or wireless (for example, infrared, radio, or microwave) manner. The computer-readable storage medium is any usable medium accessible by the computer, or a data storage device, such as a server or a data center, integrating one or more usable media. The usable medium is a magnetic medium (for example, a floppy disk, a hard disk, or a magnetic tape), an optical medium (for example, a high density digital video disc (digital video disc, DVD)), a semiconductor medium (for example, a solid-state drive (solid-state drive, SSD)), or the like.

An "embodiment" mentioned in embodiments described herein means that particular characteristics, structures, or features related to the embodiment are included in at least one embodiment. Therefore, embodiments described herein are not necessarily the same embodiments.

In addition, these particular characteristics, structures, or features is combined in one or more embodiments in any appropriate manner. Sequence numbers of the foregoing processes do not mean execution sequences in at least one embodiment. The execution sequences of the processes should be determined based on functions and internal logic of the processes, and should not constitute any limitation on implementation processes of at least one embodiment.

In at least one embodiment, "when" and "if" mean that an apparatus performs corresponding processing in an objective situation, and are not intended to limit time. The terms do not mean that the apparatus includes a determining action during implementation, and do not mean any other limitation.

A person of ordinary skill in the art understands that various numbers such as "first" and "second" in at least one embodiment are merely used for differentiation for ease of description, and are not used to limit the scope of at least one embodiment or represent a sequence.

"At least one" in at least one embodiment is alternatively described as one or more, and "a plurality of" means two, three, four, or more. This is not limited in at least one embodiment. In at least one embodiment, "first", "second", "third", "A", "B", "C", "D", and the like are used for distinguishing between technical features described by "first", "second", "third", "A", "B", "C", "D", and the like. There is no chronological order or no size order between the technical features described by "first", "second", "third", "A", "B", "C", "D", and the like.

In addition, the terms "system" and "network" in embodiments described herein are often interchangeably used. The term "and/or" in embodiments described herein describes only an association relationship between associated objects and represents that three relationships exist. For example, A and/or B represents the following three cases: only A exists, both A and B exist, and only B exists. A is singular or plural, and B is singular or plural.

The correspondences shown in the tables in at least one embodiment is configured, or is predefined. Values of the information in the tables are merely examples, and other values is configured. This is not limited in at least one embodiment. In response to a correspondence between the information and the parameters being configured, not all the correspondences shown in the tables are to be configured. For example, in the tables in at least one embodiment, correspondences shown in some rows are alternatively not configured. For another example, proper deformations and adjustments such as splitting and combination is performed based on the foregoing tables. Names of the parameters shown in titles of the foregoing tables is alternatively other names that is understood by a communication apparatus, and values or representation manners of the parameters is alternatively other values or representation manners that is understood by the communication apparatus. During implementation of the foregoing tables, another data structure, such as an array, a queue, a container, a stack, a linear table, a pointer, a linked list, a tree, a graph, a structure, a class, a pile, a hash list, or a hash table, is alternatively used.

"Predefine" in at least one embodiment is understood as "define", "define in advance", "store", "pre-store", "pre-negotiate", "pre-configure", "solidify", or "pre-burn".

A person of ordinary skill in the art is aware that, in combination with the examples described in embodiments herein, units and algorithm steps is implemented by electronic hardware or a combination of computer software and electronic hardware. Whether the functions are performed by hardware or software depends on particular applications and design constraints of the technical solutions. A person skilled in the art uses different methods to implement the described functions for each particular application, but the implementation does not go beyond the scope of at least one embodiment.

A person skilled in the art understands that, for the purpose of convenient and brief description, for a detailed working process of the foregoing system, apparatuses, and units, refer to a corresponding process in the foregoing method embodiment. Details are not described herein again.

For same or similar parts in at least one embodiment, refer to each other. In at least one embodiment and the implementations/implementation methods in embodiments, unless otherwise specified or a logical conflict occurs, terms and/or descriptions are consistent and is mutually referenced between different embodiments and between the implementations/implementation methods in embodiments. Technical features in the different embodiments and the implementations/implementation methods in embodiments is combined to form a new embodiment, implementation, or implementation method based on an internal logical relationship thereof. The foregoing descriptions are implementations of at least one embodiment, but are not intended to limit the protection scope embodiments described herein.

The foregoing descriptions are merely specific implementations of at least one embodiment, but the protection scope of embodiments described herein are not limited thereto. Any variation or replacement readily figured out by a person skilled in the art within the technical scope disclosed in at least one embodiment shall fall within the protection scope of at least one embodiment. Therefore, the protection scope of embodiments described herein shall be subject to the protection scope of the claims.

What is claimed is:

1. A signal processing method, wherein the method comprises:
   receiving a first signal, wherein the first signal includes x symbols;
   determining N quantization levels based on a signal distribution parameter of the first signal;
   determining a second signal based on the first signal;
   performing quantization processing on the second signal to obtain x groups of first quantization results, wherein the x symbols are in one-to-one correspondence with the x groups of first quantization results;
   mapping the x groups of first quantization results to a quantized first signal, wherein the quantized first signal includes x quantization levels, each group of first quantization results is mapped to one of the N types of quantization levels, N≥2, and x≥1; and
   performing signal processing on the quantized first signal.

2. The method according to claim 1, wherein the method further comprises:
   determining the signal distribution parameter by using a first scaling multiple set of a digital automatic gain control DAGC.

3. The method according to claim 2, wherein the method further comprises:
   performing scaling processing on a reference signal of the first signal via the DAGC, and performing quantization processing on a reference signal obtained through the scaling processing, to obtain second quantization results, wherein
   the first scaling multiple set includes: a scaling multiple for performing scaling processing on the reference signal when the second quantization results meet a first condition.

4. The method according to claim 3, wherein the performing the quantization processing on the reference signal obtained through the scaling processing, to obtain the second quantization results includes performing the quantization processing on the reference signal obtained through the scaling processing, to obtain the second quantization results that meet a first condition that includes a value of a probability the second quantization results including a preset bit sequence within a preset probability value interval.

5. The method according to claim 2, wherein the determining a second signal based on the first signal includes:
   performing scaling processing on the first signal based on a second scaling multiple to obtain the second signal, wherein the second scaling multiple is in the first scaling multiple set.

6. The method according to claim 1, wherein the method further comprises:
   when the first signal does not meet a second condition, determining an adjustment parameter and a third scaling multiple based on the signal distribution parameter of the first signal; and
   the determining a second signal based on the first signal includes:
   adjusting the first signal based on the adjustment parameter to obtain wherein an adjusted first signal that meets the second condition; and
   performing scaling processing on the adjusted first signal based on the third scaling multiple, to obtain the second signal.

7. The method according to claim 6, wherein the adjusting the first signal based on the adjustment parameter to obtain the adjusted first signal that meets the second condition includes adjusting the first signal based on the adjustment parameter to obtain the adjusted first signal that meets the second condition including: a distribution of amplitudes of the adjusted first signal represented by a weighted sum of M first distributions, and average values of the M first distributions obey a uniform distribution or absolute values of the average values of the M first distributions are equal, wherein M≥2.

8. The method according to claim 1, wherein the method further comprises:
   determining, through phase estimation, a phase change value of the first signal transmitted on a channel; and the determining a second signal based on the first signal includes:
performing phase compensation on the first signal based on the phase change value; and
performing scaling processing on a first signal obtained through the phase compensation, to obtain the second signal.

9. The method according to claim 1, wherein the receiving the first signal includes receiving the first signal that includes a phase change value transmitted on a channel, wherein the phase change value is non-zero, and that include a distribution of amplitudes represented by a weighted sum of N first distributions, wherein the N types of quantization levels includes an average value of each of the N first distributions.

10. The method according to claim 9, wherein the receiving the first signal the includes the distribution of the amplitudes of the first signal includes receiving the first signal that is represented by a weighted sum of K first distributions, and wherein the determining the N quantization levels based on the signal distribution parameter of the first signal includes determining the N quantization levels based on the signal distribution parameter of the first signal that includes an average value of each of the K first distributions, wherein $K \geq 2$.

11. The method according to claim 10, wherein the determining the N quantization levels based on the signal distribution parameter of the first signal further includes determining the N quantization levels based on the signal distribution parameter having a standard deviation of each of the K first distributions.

12. The method according to claim 10, wherein the determining the N quantization levels based on the signal distribution parameter having the standard deviation of each of the K first distributions includes determining the N quantization levels based on the signal distribution parameter having a Gaussian distribution.

13. The method according to claim 1, wherein the receiving the first signal includes receiving a single-carrier signal.

14. A communication apparatus, comprising a communication unit and a processing unit, wherein
the communication unit is configured to receive a first signal, wherein the first signal includes x symbols; and
the processing unit is configured to: determine N types of quantization levels based on a signal distribution parameter of the first signal; determine a second signal based on the first signal; perform quantization processing on the second signal to obtain x groups of first quantization results; map the x groups of first quantization results to a quantized first signal, wherein the quantized first signal includes x quantization levels; and perform signal processing on the quantized first signal, wherein the x symbols are in one-to-one correspondence with the x groups of first quantization results, and each group of first quantization results is mapped to one of the N types of quantization levels, wherein $N \geq 2$ and $x \geq 1$.

15. The apparatus according to claim 14, wherein
the processing unit is further configured to: determine the signal distribution parameter by using a first scaling multiple set of a digital automatic gain control DAGC.

16. The apparatus according to claim 15, wherein
the processing unit is further configured to: perform, via the DAGC, scaling processing on a reference signal of the first signal, and perform quantization processing on a reference signal obtained through the scaling processing, to obtain second quantization results, wherein the first scaling multiple set includes: a scaling multiple for performing scaling processing on the reference signal when the second quantization results meet a first condition.

17. The apparatus according to claim 16, wherein the second quantization results meet a first condition that includes a value of a probability the second quantization results includes a preset bit sequence within a preset probability value interval.

18. The apparatus according to claim 15, wherein
in response to the processing unit being configured to determine the second signal based on the first signal, the processing unit is configured to: perform scaling processing on the first signal based on a second scaling multiple to obtain the second signal, wherein the second scaling multiple is in the first scaling multiple set.

19. The apparatus according to claim 14, wherein
the processing unit is further configured to: when the first signal does not meet a second condition, determine an adjustment parameter and a third scaling multiple based on the signal distribution parameter of the first signal; and
in response to the processing unit being configured to determine the second signal based on the first signal, the processing unit is configured to: adjust the first signal based on the adjustment parameter, wherein an adjusted first signal meets the second condition; and perform scaling processing on the adjusted first signal based on the third scaling multiple, to obtain the second signal.

20. The apparatus according to claim 19, wherein the adjusted first signal that meets the second condition includes: a distribution of amplitudes of the adjusted first signal represented by a weighted sum of M first distributions, and average values of the M first distributions obey a uniform distribution or absolute values of the average values of the M first distributions are equal, wherein $M \geq 2$.

* * * * *